(12) United States Patent
Wu et al.

(10) Patent No.: US 12,334,400 B2
(45) Date of Patent: Jun. 17, 2025

(54) SEMICONDUCTOR STRUCTURE AND METHOD OF FORMING THEREOF

(71) Applicant: NANYA TECHNOLOGY CORPORATION, New Taipei (TW)

(72) Inventors: Ming Hsun Wu, New Taipei (TW); Hsueh-Han Lu, New Taipei (TW); Yao Ching Chiu, Chiayi County (TW)

(73) Assignee: NANYA TECHNOLOGY CORPORATION, New Taipel (TW)

( * ) Notice: Subject to any disclaimer, the term of this patent is extended or adjusted under 35 U.S.C. 154(b) by 444 days.

(21) Appl. No.: 18/059,398

(22) Filed: Nov. 28, 2022

(65) Prior Publication Data

US 2024/0178063 A1    May 30, 2024

(51) Int. Cl.
| | |
|---|---|
| *H01L 21/768* | (2006.01) |
| *H01L 21/033* | (2006.01) |
| *H01L 23/522* | (2006.01) |
| *H01L 23/528* | (2006.01) |
| *H01L 23/532* | (2006.01) |

(52) U.S. Cl.
CPC .... *H01L 21/76897* (2013.01); *H01L 21/0337* (2013.01); *H01L 21/76801* (2013.01); *H01L 23/5226* (2013.01); *H01L 23/528* (2013.01); *H01L 23/53295* (2013.01)

(58) Field of Classification Search
CPC ........... H01L 21/76897; H01L 21/0337; H01L 21/76801; H01L 23/5226; H01L 23/528; H01L 23/53295

USPC ......................................................... 257/734
See application file for complete search history.

(56) References Cited

U.S. PATENT DOCUMENTS 9,337,196 B2 *   5/2016   Cheng ................. H10D 62/832
2007/0012906 A1    1/2007   Kim et al.

FOREIGN PATENT DOCUMENTS

TW            I718583 B      2/2021

* cited by examiner

*Primary Examiner* — Tu-Tu V Ho
(74) *Attorney, Agent, or Firm* — CKC & Partners Co., LLC

(57) ABSTRACT

A method of forming a semiconductor structure includes a number of operations. Conductors are formed in a first dielectric layer on a substrate. First conductive vias overlapping the conductors are formed in a second dielectric layer on the substrate. Electrodes are formed in a third dielectric layer on the substrate, wherein each of the electrodes overlaps one of the first conductive vias. A hard mask is formed on the third dielectric layer. Mandrel exposures are formed on the hard mask. Patterning spacers is formed on sidewalls of the mandrel exposures. The mandrel exposures are removed. The hard mask is patterned based on the patterning spacers and the third dielectric layer is patterned based on the patterning spacers to form conductive lines along the second direction in the third dielectric layer, wherein each of the conductive lines overlaps one of the first conductive vias.

20 Claims, 27 Drawing Sheets

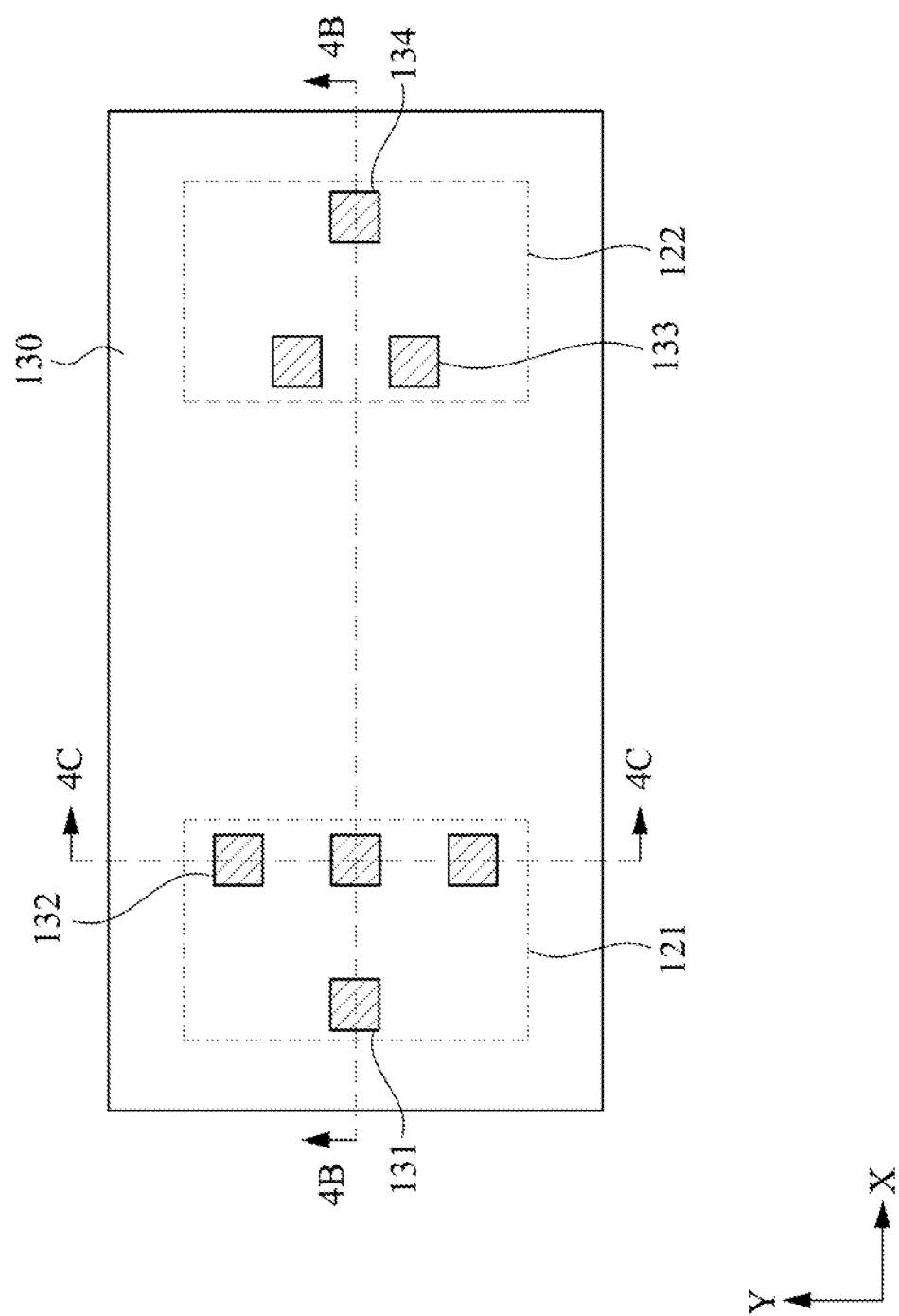

SEMICONDUCTOR STRUCTURE AND METHOD OF FORMING THEREOF

BACKGROUND

Field of Invention

The present disclosure relates to semiconductor structures and method of forming semiconductor structures.

Description of Related Art

With the advancement of semiconductor technology, sizes of semiconductor elements and corresponds routings are reduced, and some of semiconductor manufacturing processes are changed. However, a kind of layout designs is felt once the semiconductor manufacturing processes are changed. For example, a litho-etch-litho-etch (LE-LE) process can be used to form stitch-like structures used for connections. However, once the LE-LE process is replaced by other semiconductor manufacturing process, the stitch-like structures cannot be provided.

Therefore, those in the industry are endeavoring to find a solution that can induce a contact structure used to replace the stitch-like structures in the LE-LE layout.

SUMMARY

An aspect of the present disclosure is related to a method of forming a semiconductor structure.

According to one or more embodiments of the present disclosure, a method of forming a semiconductor structure includes a number of operations. A plurality of conductors is formed in a first dielectric layer on a substrate, wherein the conductors extend in a first direction. A plurality of first conductive vias is formed in a second dielectric layer on the substrate, wherein each of the first conductive vias overlaps one of the conductors. A third dielectric layer is formed on the substrate. A plurality of electrodes is formed in the third dielectric layer, wherein each of the electrodes overlaps one of the first conductive vias. A hard mask is formed on the third dielectric layer. A plurality of mandrel exposures is formed on the hard mask, wherein the mandrel exposures extend in a second direction different from the first direction. A plurality of patterning spacers is formed on sidewalls of the mandrel exposures. The mandrel exposures are removed. The hard mask is patterned based on the patterning spacers. A plurality of conductive lines is formed in the third dielectric layer based on the patterned hard mask, wherein the conductive lines extend in the second direction and are separated from the electrodes in the second direction, and each of the conductive lines overlaps a corresponding one of the first conductive vias.

In one or more embodiments of the present disclosure, the third dielectric layer is directly above or directly below the second dielectric layer.

In one or more embodiments of the present disclosure, forming the patterning spacers on the sidewalls of the mandrel exposures includes a number of operations. A spacer layer covering the mandrel exposures and a top surface of the third dielectric layer is deposited. The spacer layer is etched to expose tops of the mandrel exposures, wherein the spacer layer remaining on the sidewalls of the mandrel exposures forms the patterning spacers.

In one or more embodiments of the present disclosure, the mandrel exposures are formed to be aligned with the first conductive vias.

In one or more embodiments of the present disclosure, the conductors include a first conductor and a second conductor arranged in the first direction.

In one or more embodiments of the present disclosure, the conductors include a first conductor and a second conductor separated from each other in the second direction.

In one or more embodiments of the present disclosure, the electrodes include a first electrode and a second electrode arranged in the first direction.

In some embodiments, the conductors include a first conductor, a second conductor and a third conductor, the second conductor is between the first conductor and the third conductor in the first direction, the second conductor is at a first side of the first conductive lines, the first conductor and the third conductor is at an opposite second side of the first conductive lines, and the first electrode and the second electrode overlap the first conductor and the third conductor, respectively.

In one or more embodiments of the present disclosure, the method further includes a number of operations. A second conductive via extending from one of the conductive lines to one of the conductors is formed, wherein one of the electrodes overlaps the second conductive via.

An aspect of the present disclosure is related to a method of forming a semiconductor structure.

According to one or more embodiments of the present disclosure, a method of forming a semiconductor structure includes a number of operations. A first conductor is formed in a first dielectric layer on a substrate, wherein the first conductor extends in a first direction. A second dielectric layer is formed on the first dielectric layer and a plurality of first conductive vias is formed in the second dielectric layer, wherein the first conductive vias overlap the first conductor and are arranged in the first direction. A third dielectric layer is formed on the second dielectric layer. A hard mask is formed on the third dielectric layer. A plurality of mandrel exposures is formed on the hard mask, wherein the mandrel exposures are separated from each other in the first direction, extend in a second direction different from the first direction and respectively overlap the first conductive vias. A spacer layer is deposited on the mandrel exposures. The spacer layer is etched to form a plurality of patterning spacers on sidewalls of the mandrel exposures, wherein the patterning spacers extend in the second direction and are separated from each other in the first direction, each of the patterning spacers extends from a top of one of the mandrel exposures to a top surface of the hard mask layer, and immediately-adjacent two of the patterning spacers is located between immediately-adjacent two of the mandrel exposures. The mandrel exposures are removed. The hard mask is patterned by the patterning spacers. A plurality of first conductive lines and a plurality of second conductive lines are formed in the third dielectric layer based on the patterned hard mask, wherein the first conductive lines and the second conductive lines extend in the second direction and alternatively arranged in the first direction, and each of the first conductive lines overlaps one of the first conductive vias.

In one or more embodiments of the present disclosure, the method further includes a number of operations. A second conductive via is formed in the second dielectric layer, wherein the second conductive via is separated from the first conductive vias in the second direction and overlaps the first conductor. An electrode is formed in the third dielectric layer, wherein the electrode overlaps the first conductor and is connected to second conductive via.

In one or more embodiments of the present disclosure, the method further includes a number of operations. A second conductor is formed in the first dielectric layer, wherein the second conductor extends in the first direction and is separated from the first conductor in the second direction. A plurality of second conductive vias is formed in the second dielectric layer, wherein the second conductive vias overlap the second conductor and are arranged in the first direction, and the second conductive lines are connected to the second conductive vias after the first conductive lines and the second conductive lines are formed.

In some embodiments, the method further includes a number of operations. A third conductive via being in the second dielectric layer and overlaps the first conductor is formed, wherein the third conductive via is separated from the first conductive vias in the second direction. A fourth conductive via being in the second dielectric layer and overlaps the second conductor is formed, wherein the fourth conductive via is separated from the second conductive vias in the second direction. A first electrode being in the third dielectric layer and overlapping the third conductive via is formed. A second electrode being in the third dielectric layer and overlapping the fourth conductive via is formed.

In one or more embodiments of the present disclosure, a width of each of the first conductive lines in the first direction is equal to a width of each of the mandrel exposures, and a width of each of the second conductive lines in the first direction is equal to a distance between immediately-adjacent two of the patterning spacers located between immediately-adjacent two of the mandrel exposures.

In one or more embodiments of the present disclosure, the first conductive lines and the second conductive lines is connected to a plurality of transistors on the substrate.

An aspect of the present disclosure is related to a semiconductor structure.

According to one or more embodiments of the present disclosure, a semiconductor structure includes a substrate, a first dielectric layer, a plurality of conductors, a second dielectric layer, a plurality of conductive vias, a third dielectric layer, a plurality of conductive lines and a plurality of electrode. The first dielectric layer located at a first level on the substrate. The conductors are located in the first dielectric layer. The conductors extend in a first direction. The second dielectric layer is located at a second level on the substrate. The conductive vias are located in the second dielectric layer. Each of the conductive vias overlaps one of the conductors. The third dielectric layer is located at a third level on the substrate. The conductive lines are located in the third dielectric layer. The conductive lines extend in a second direction different from the first direction. A distance between immediately-adjacent two of the conductive lines is less than a distance between immediately-adjacent two of the conductive vias in the first direction. Each of the conductive lines overlaps one of the conductive vias. The electrodes are located in the third dielectric layer, wherein each of the electrodes is connected to one of the conductive vias.

In one or more embodiments of the present disclosure, the first level is directly above or directly below the second level.

In one or more embodiments of the present disclosure, the conductors comprise a first conductor and a second conductor. The first conductor and the second conductor are located at a first side and a second side opposite to the first side of the conductive lines. The conductive lines comprise a plurality of first conductive lines and a plurality of second conductive lines. The first conductive lines and the second conductive lines are alternatively arranged in the first direction and spatially isolated from each other. The first conductive lines are connected to the first conductor. The second conductive lines are connected to the second conductor.

In one or more embodiments of the present disclosure, the conductive via comprises a plurality of first conductive vias at the first side of the conductive lines and a plurality of second conductive vias at the second side of the conductive lines.

In one or more embodiments of the present disclosure, the semiconductor structure further includes a transistor. The transistor is located in the substrate and connected to the conductive lines.

In summary, improved methods of forming a semiconductor structure are provided. For a situation that a lot of contact routings are formed at the same level, a further connection structure can be formed to connecting the contact routings from each other.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1A:
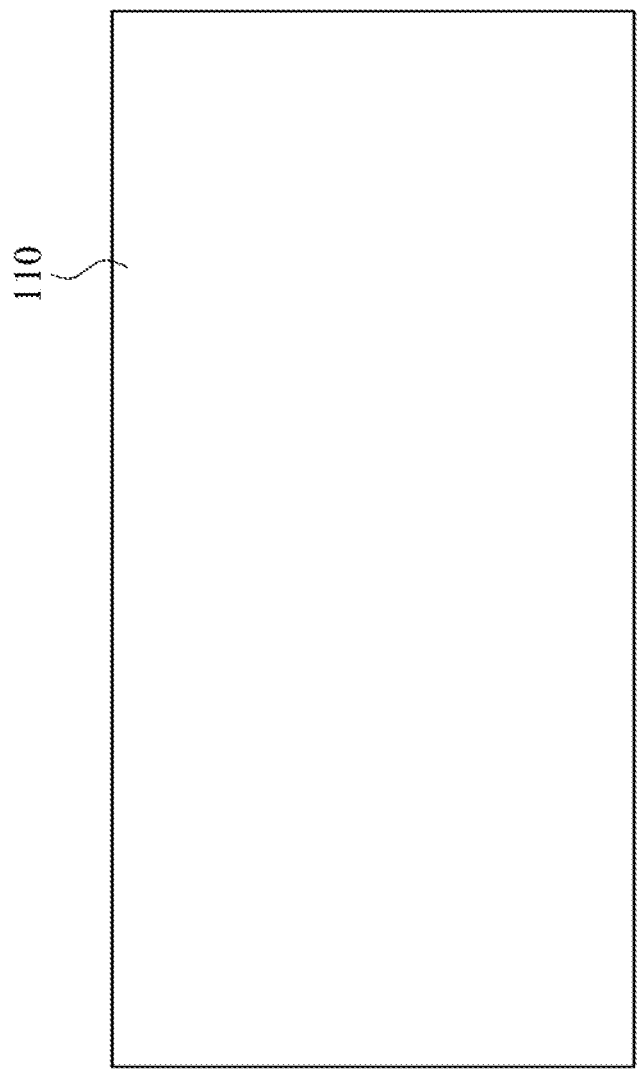
FIGS. 1A-11C illustrate schematic top views and cross-sections in different operations of a method of forming a semiconductor structure according to one or more embodiments of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

In some of semiconductor processes, a stich-like structure is formed to connect two or more connection structures at the same horizontal level. For example, a first metal layer and a second metal layer are formed in a first level, and a stich-like structure is then formed to extend from one of the first metal layer and the second metal layer to another, so that the formed stich-like structure is used as a contact and has a stitch-shape extending from one of the first metal layer and the second metal layer to another and the first level. In one or more embodiments, the stitch-like structure can be formed by a litho-etch-litho-etch (LE-LE) process. However, once the LE-LE process is changed to a self-aligned double patterning (SADP) process, which can be used reduce the size of semiconductor integrated circuits, the stitch-like structure would be felt since the layers at the same horizontal level are formed at the same time in a SADP process.

In one or more embodiments of the present disclosure, an improved connection structure is used to replace the stitch-like structure, and critical dimension of the formed circuits can be further reduced.

Figure 1B:
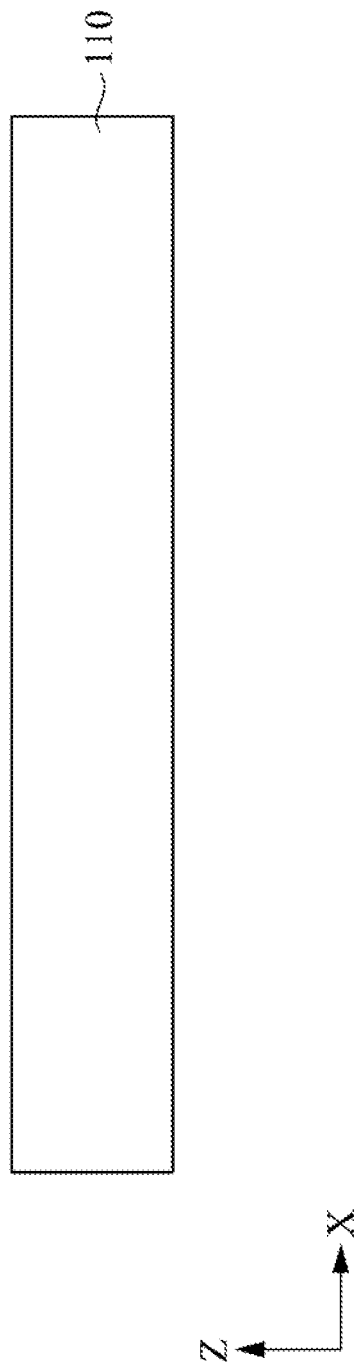

Reference is made in FIGS. 1A-11C. FIGS. 1A-11C illustrate schematic top views and cross-sections in different operations of a method of forming a semiconductor structure 100 according to one or more embodiments of the present disclosure;

As shown in FIGS. 1A and 1B, a substrate 110 is provided. FIG. 1A is a schematic top view in a middle stage of forming a semiconductor structure. FIG. 1B is a side view of FIG. 1A. In one or more embodiments of the present disclosure, the substrate 110 is a semiconductor substrate. For example, material of the substrate 110 can be silicon or other suitable semiconductor material. In some embodiments, one or more elements can be formed on the substrate 110. For the purpose of simple description, one or more elements are not shown in figures.

Figure 2A:
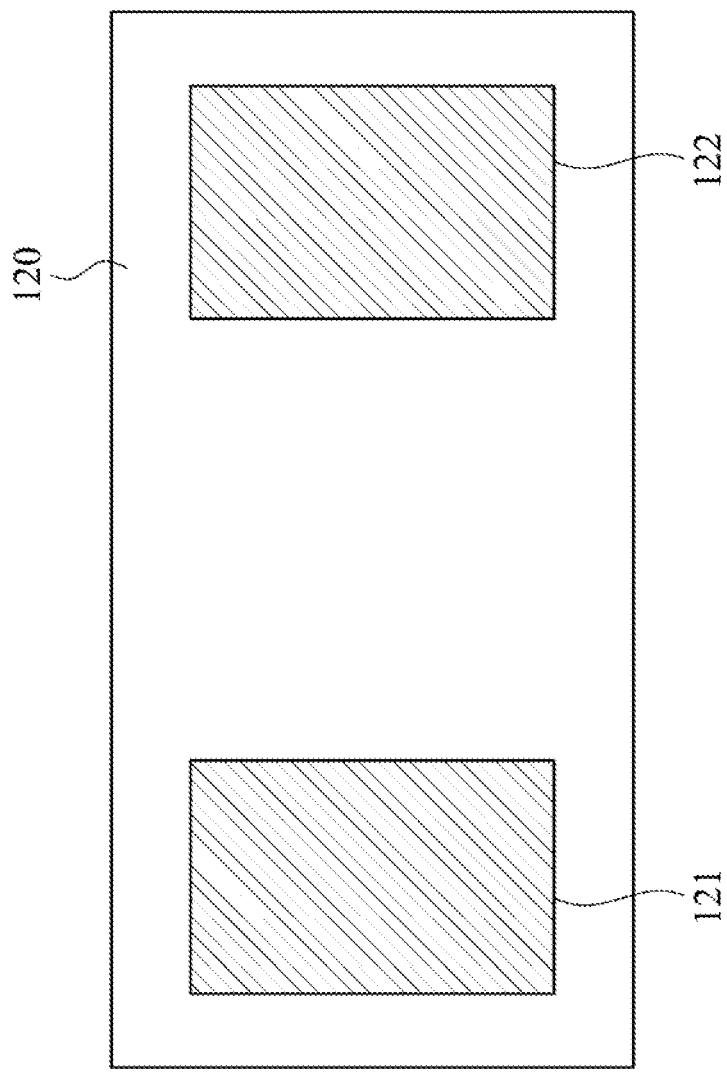
Figure 2B:
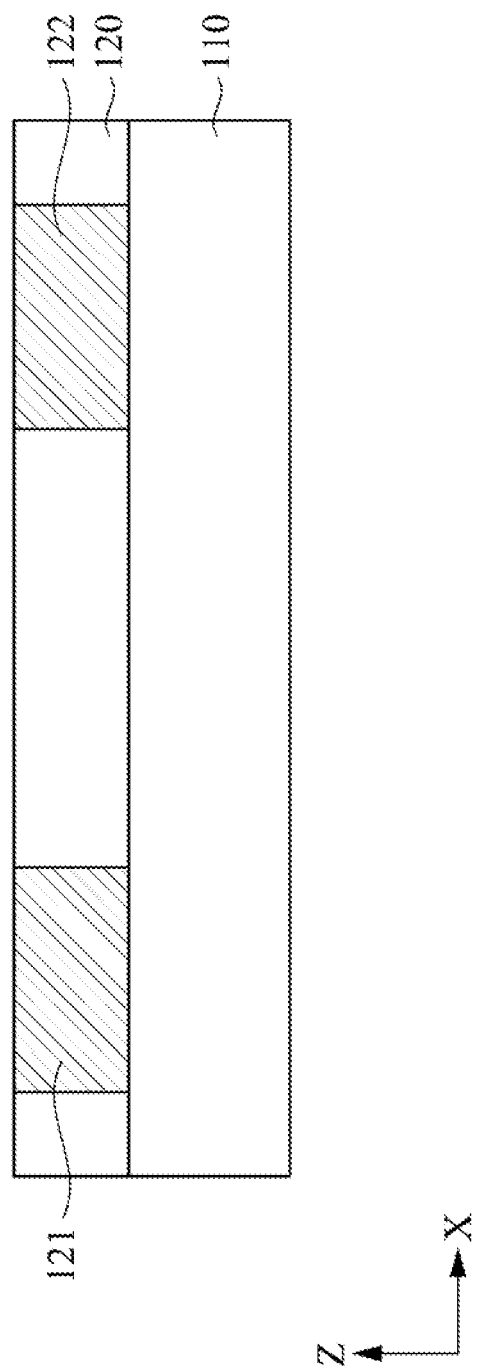

Reference is made in FIGS. 2A and 2B. FIG. 2A is a schematic top view in a middle stage of forming a semiconductor structure. FIG. 2B is a cross-section view of FIG. 2A. In this embodiment, a dielectric layer 120 is formed on a top surface of the substrate 110, and conductors 121 and 122 are then formed in the dielectric layer 120. In this embodiment, the dielectric layer 120 is formed at a level higher than a level of the substrate 110. In one or more embodiments, the conductor 121 and the conductor 122 can be regarded as a GC level and used as common connector for electrically connecting one or more elements from levels different from the GC level. In one or more embodiments, material of the conductor 121 and the conductor 122 can be poly semiconductor, metal or other suitable conductive material. In one or more embodiment, material of the dielectric layer 120 can include oxide material. For example, the dielectric layer 120 can be a semiconductor oxide layer. Other suitable material can be used to isolate the elements in the dielectric from each other.

As shown in FIGS. 2A and 2B, the conductor 121 and the conductor 122 are separated from each other in a horizontal direction X. Further, as shown in FIG. 2A, the conductor 121 and the conductor 122 extend in a direction Y perpendicular to the direction X. In one or more embodiments of the present disclosure, the conductor 121 and the conductor 122 can be formed as follow. The dielectric layer 120 is formed on the substrate 110. A patterned hard mask (not shown in figure) is formed on the dielectric layer 120. Based on the patterned hard mask, openings separated from each other in the direction X are formed in the dielectric layer 120, and the conductor 121 and the conductor 122 are formed in the spaced openings, respectively.

Figure 3A:
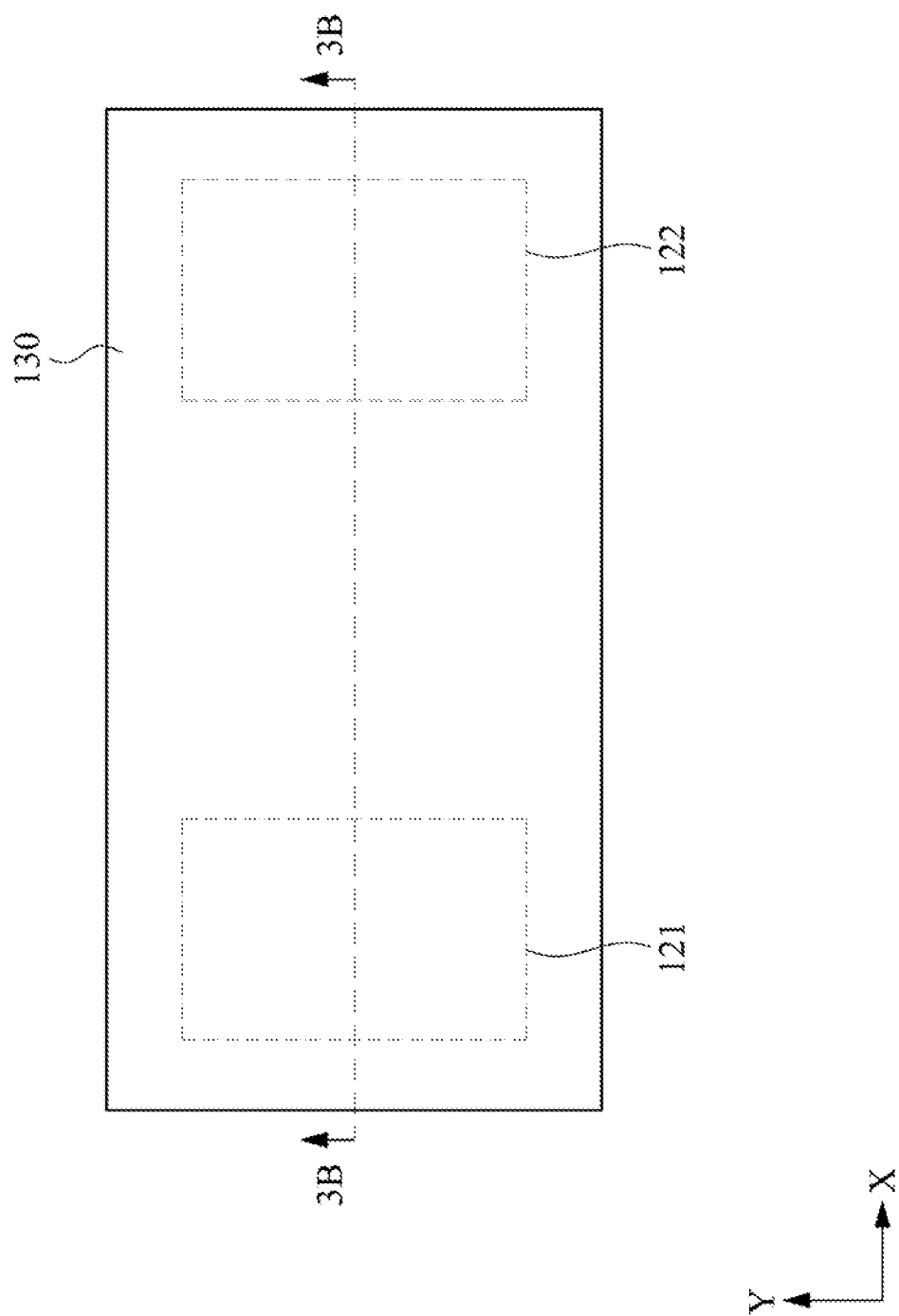
Figure 3B:
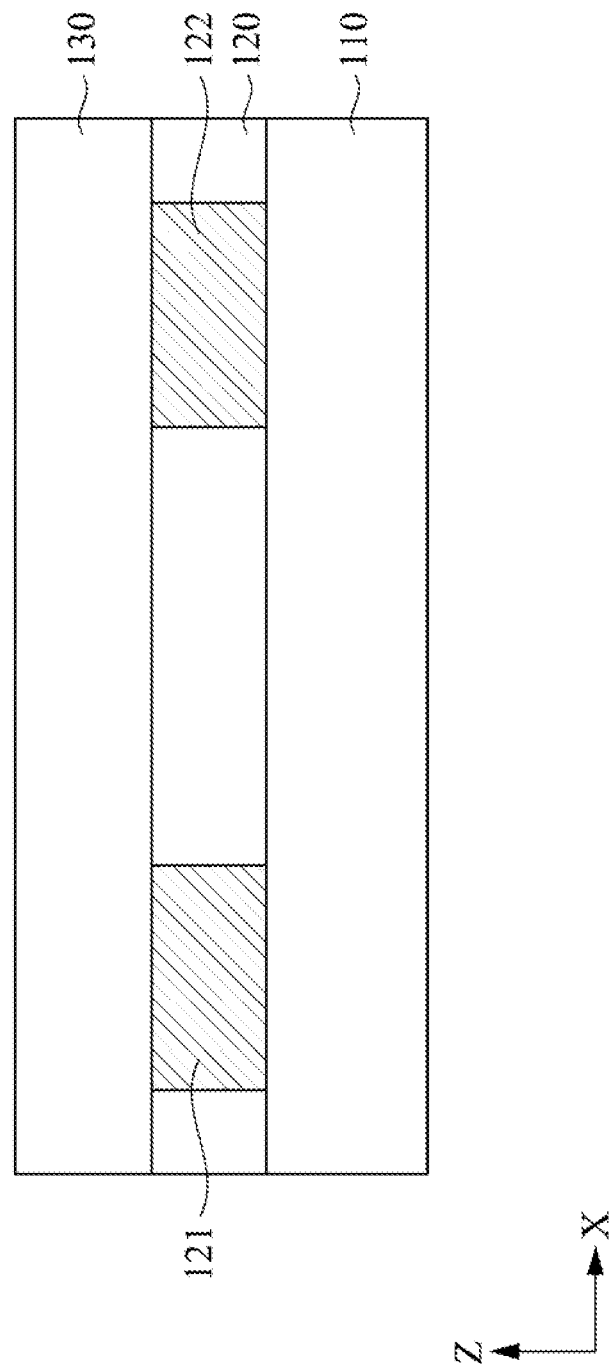

Reference is made in FIGS. 3A and 3B. FIG. 3A is a schematic top view in a middle stage of forming a semiconductor structure. FIG. 3B is a cross-section view of FIG. 3A.

A dielectric layer 130 is formed on the dielectric layer 120 and covers top surfaces of the dielectric layer 120, the conductor 121 and the conductor 122. In FIG. 3A, the conductors 121 and 122 are covered by the dielectric layer 130, and regions of the conductors 121 and 122 are presented in dash-lines in FIG. 3A. In this embodiment, the dielectric layer 130 is formed at a level higher than the level of the dielectric layer 120 and the substrate 110. In this embodiment, the dielectric layer 120 with conductors 121 and 122 within is directly below the dielectric layer 130.

In one or more embodiments of the present disclosure, the dielectric layer 130 can be an oxide layer. For example, material of the dielectric layer 130 includes semiconductor oxide or other suitable dielectric material.

Figure 4B:
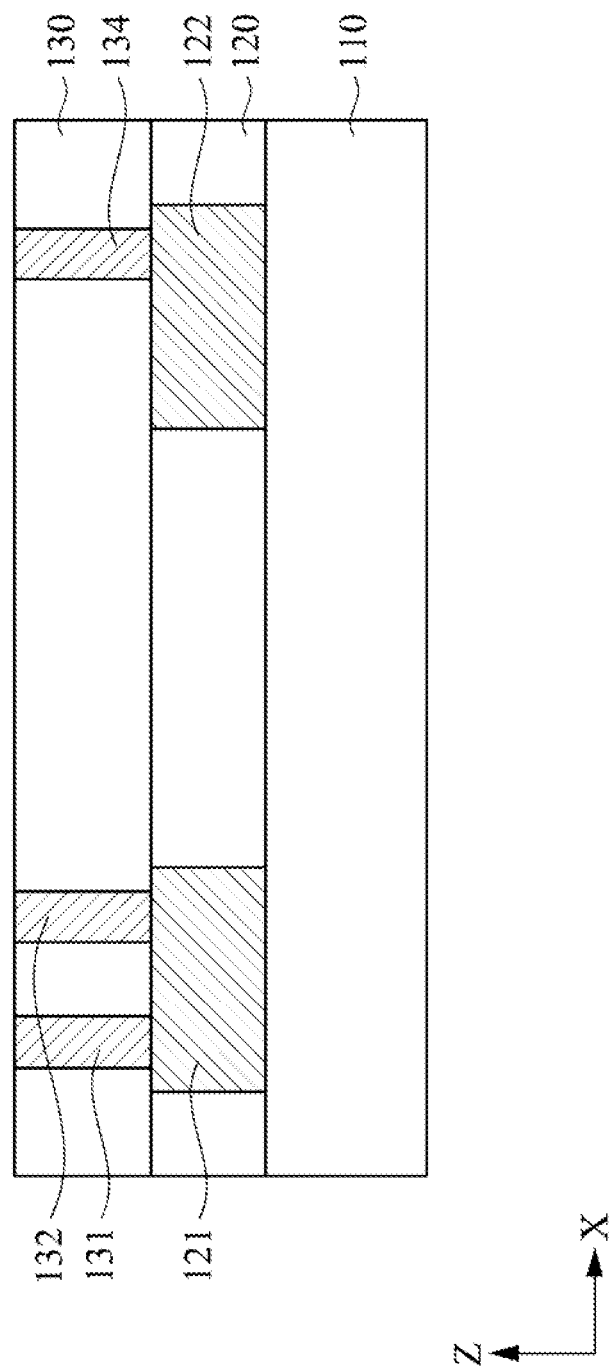
Figure 4C:
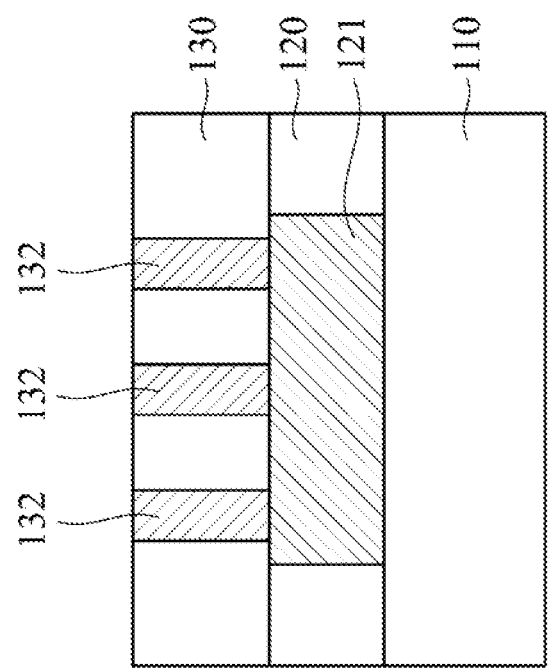

Reference is made in FIG. 4A-4C. FIG. 4A is a schematic top view in a middle stage of forming a semiconductor structure. In FIG. 4A, the conductors 121 and 122 are covered by the dielectric layer 130, and regions of the conductors 121 and 122 are presented in dash-lines in FIG. 4A. FIGS. 4B and 4C are cross-section views of FIG. 4A along different cross-section lines. As shown in FIGS. 4A-4C, in this embodiment, a conductive via 131, a plurality of conductive vias 132, a plurality of conductive vias 133 and a conductive via 134 are formed in the dielectric layer 130. The conductive via 131, the conductive vias 132, the conductive vias 133 and the conductive via 134 are separated from each other in the direction X.

In one or more embodiments, the conductive via 131, the conductive vias 132, the conductive vias 133 and the conductive via 134 can be formed as follow. A patterned hard mask (not shown in figures) is formed on the dielectric layer 130. A plurality of openings corresponding to the conductive via 131, the conductive vias 132, the conductive vias 133 and the conductive via 134 are formed in the dielectric layer 130, and then, conductive material is filled with the formed openings to form the conductive via 131, the conductive vias 132, the conductive vias 133 and the conductive via 134. In some embodiments, conductive material includes poly semiconductor, metal or other suitable material.

As shown in FIG. 4A, in this embodiment, the conductive via 131 and the conductive vias 132 overlap the conductor 121. In FIG. 4B, the conductive via 131 and the conductive vias 132 are in contact with the conductor 121. Similarly, as shown in FIGS. 4A and 4B, the conductive via 133 and the conductive vias 134 overlap and are in contact with the conductor 122.

Similarly, as shown in FIGS. 4A and 4C, in this embodiment, the formed conductive vias 132 are arranged on the conductor 121 in the direction Y perpendicular to the direction X. In other words, an extending direction of the conductor 121 is the same as an arrangement direction of the conductive vias 132, so that all of the conductive vias 132 are able to overlap the conductor 121. Similarly, as shown in FIG. 4A, the conductive vias 133 are arranged in the direction Y, and the conductor 122 also extends in the direction X, and all of the conductive vias 133 overlap the conductor 122.

In one or more embodiments of the present disclosure, the conductive via 131, the conductive vias 132, the conductive vias 133 and the conductive via 134 can be regarded as a Ce level, which is higher than the substrate 110 and the GC level. The conductive vias 131 and 134 can be connected to different electrodes. The conductive vias 132 and the conductive vias can be connected to conductive lines. As shown in FIG. 4A, the conductive vias 132 and the conductive vias 133 are alternate in the Y direction, so that the conductive vias 132 and the conductive vias 133 are able to be connected to different conductive lines separated from each other in the direction Y.

Figure 5A:
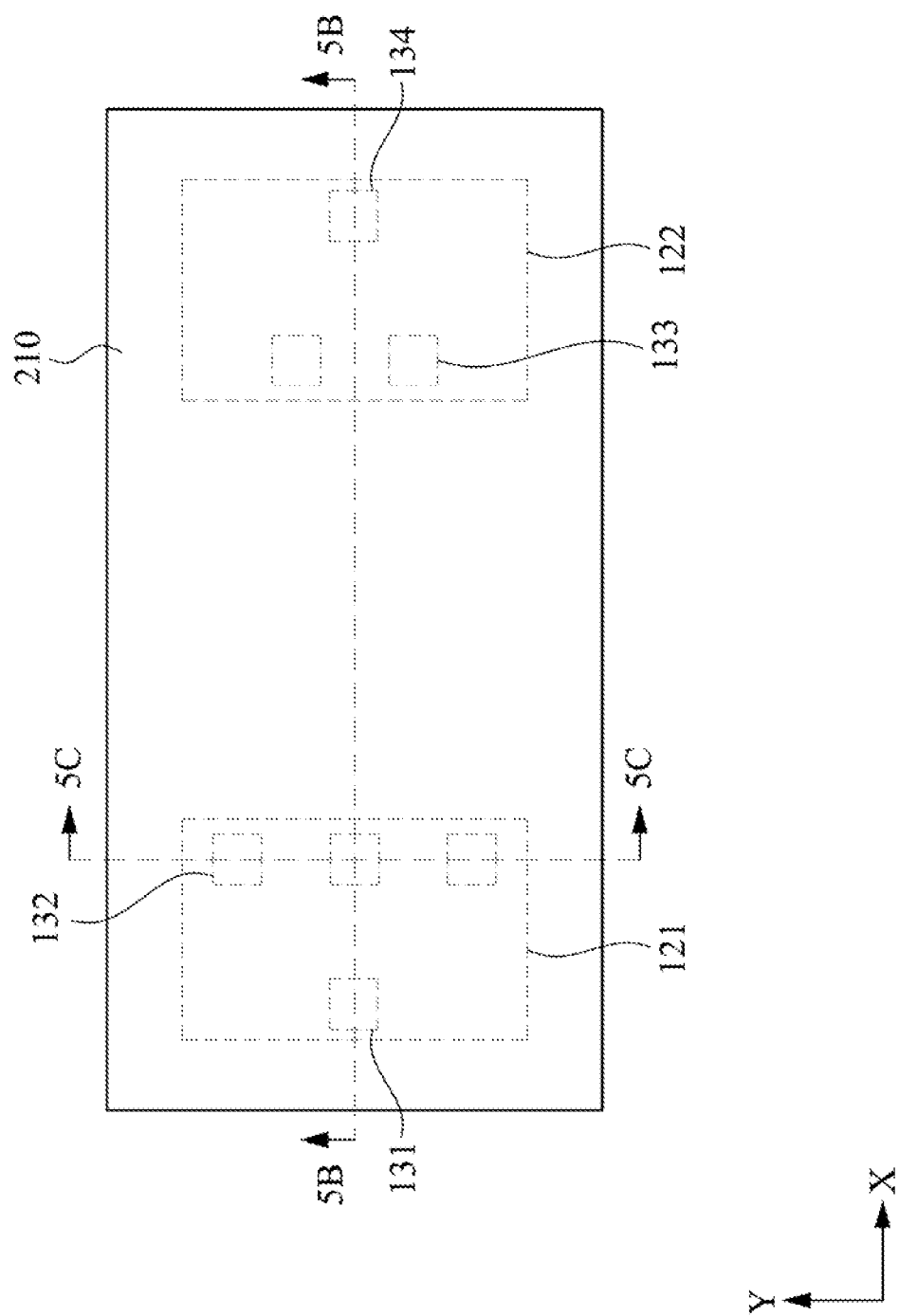
Figure 5B:
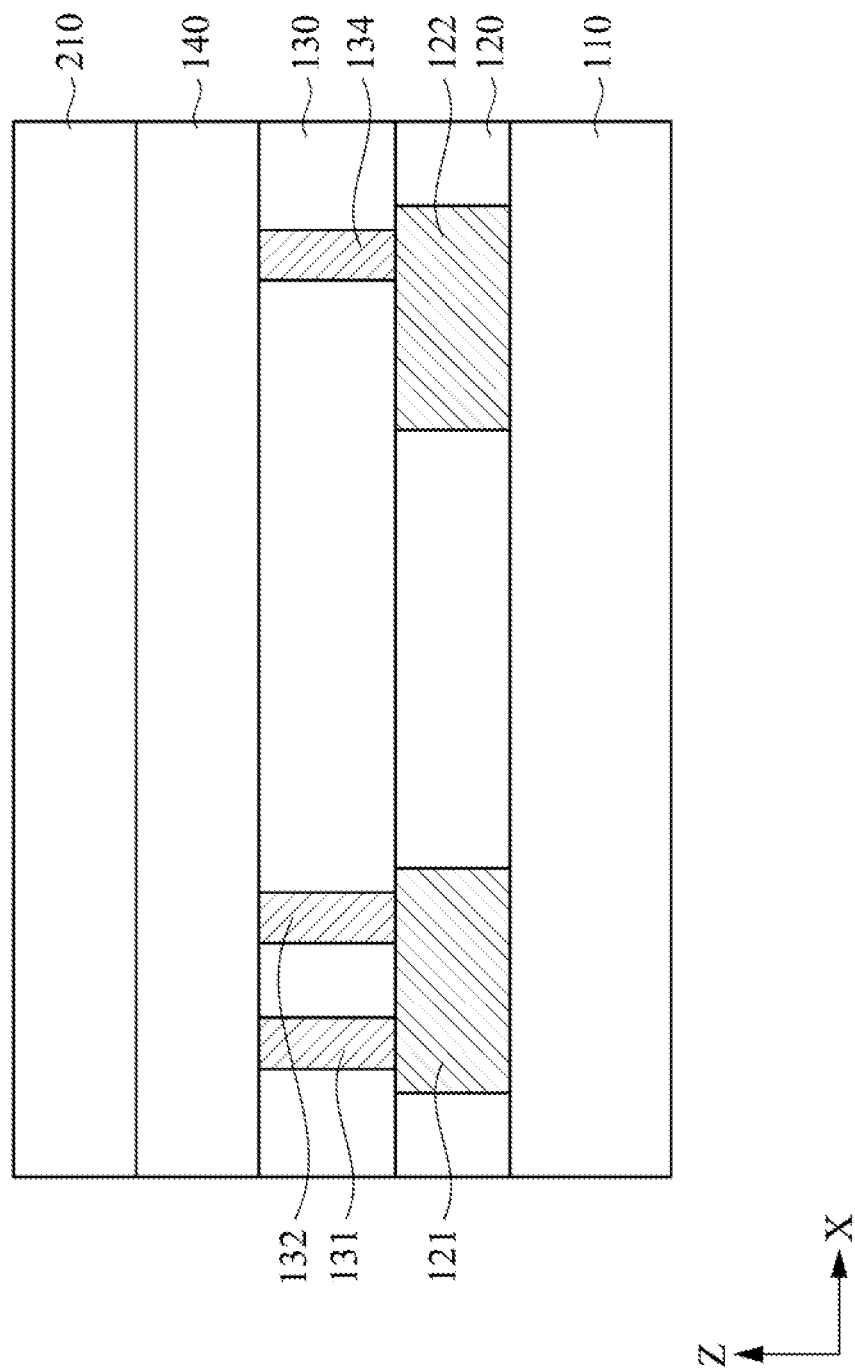
Figure 5C:
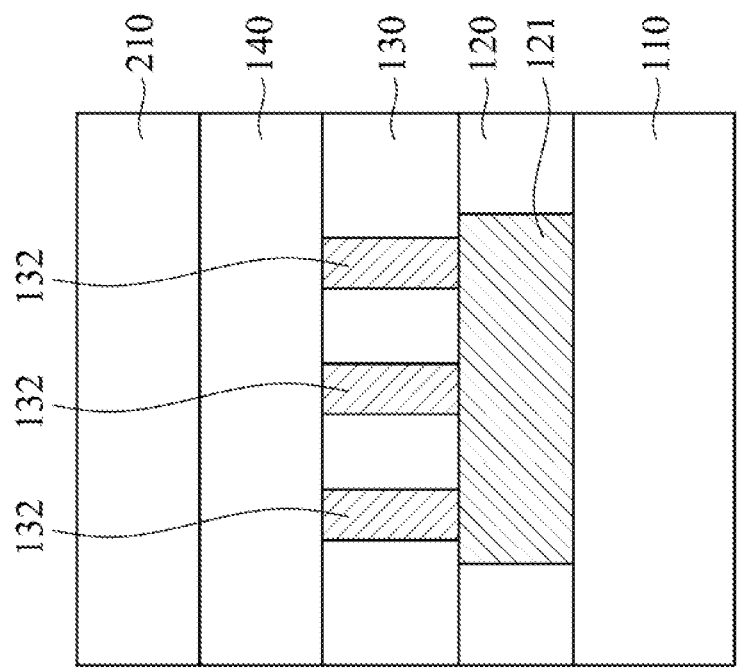
Figure 5C:
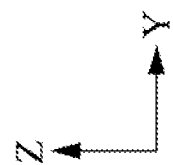

Reference is made in FIGS. 5A-5C. FIG. 5A is a schematic top view in a middle stage of forming a semiconductor structure. In FIG. 5A, the conductors 121, 122 and the conductive vias 131, 132, 133 and 134 are covered by the dielectric layer 130, and the regions of the conductors 121, 122 and the conductive vias 131, 132, 133 and 134 are presented in dash-lines in FIG. 5A. FIGS. 5B and 5C are cross-section views of FIG. 5A along different cross-section lines. In FIGS. 5A-5C, a dielectric layer 140 is formed on the dielectric layer 140. The dielectric layer 140 is at a level higher than the substrate 110, the dielectric layer 120 and the dielectric layer 130. Top surfaces of the dielectric layer 130, the conductive via 131, the conductive vias 132, the conductive vias 133 and the conductive via 134 are covered by the dielectric layer 140. A hard mask 210 is further formed on the dielectric layer 140.

In some embodiment, material of the dielectric layer 130 includes oxide material, semiconductor oxide material or other suitable dielectric material.

Figure 6A:
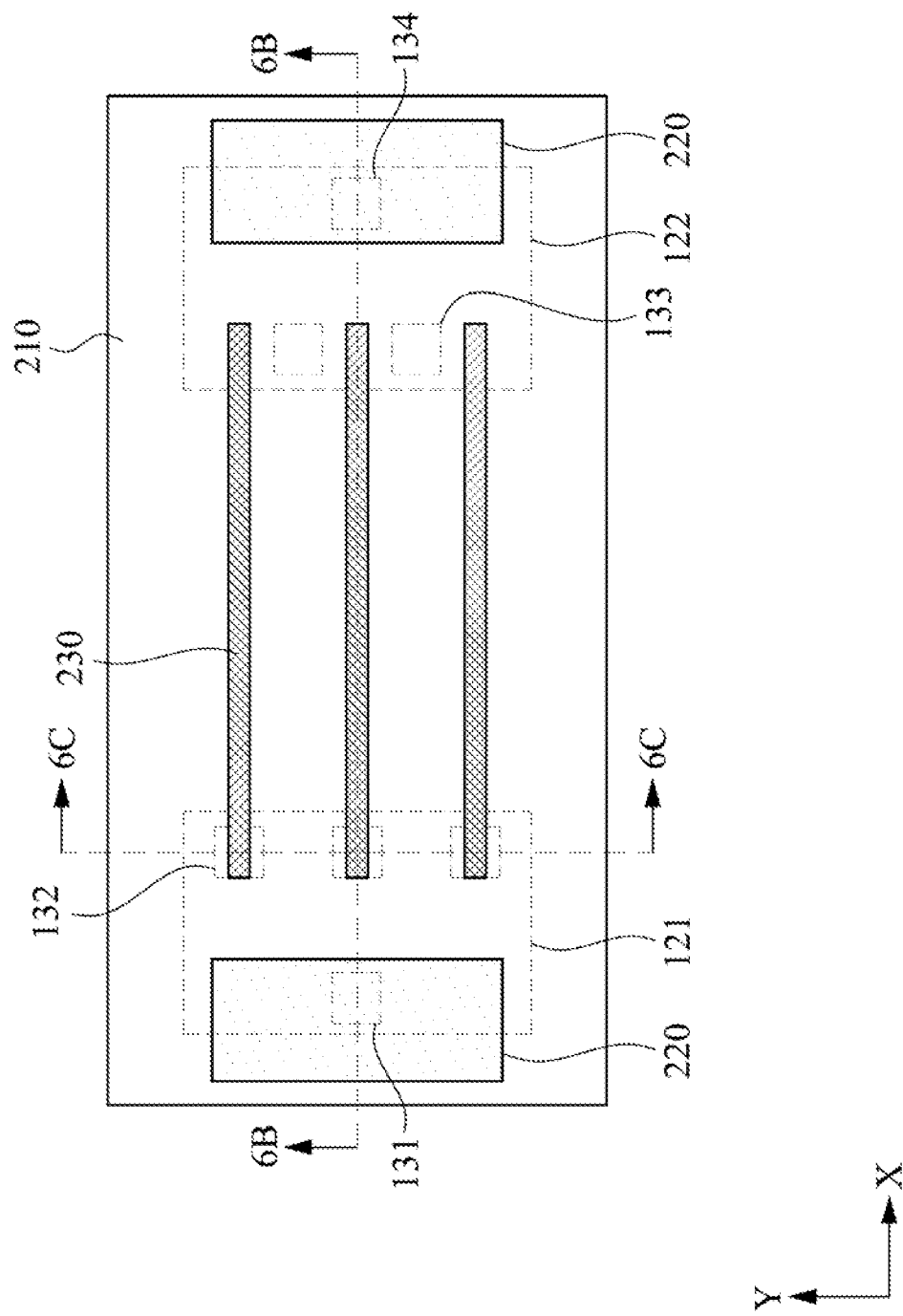
Figure 6B:
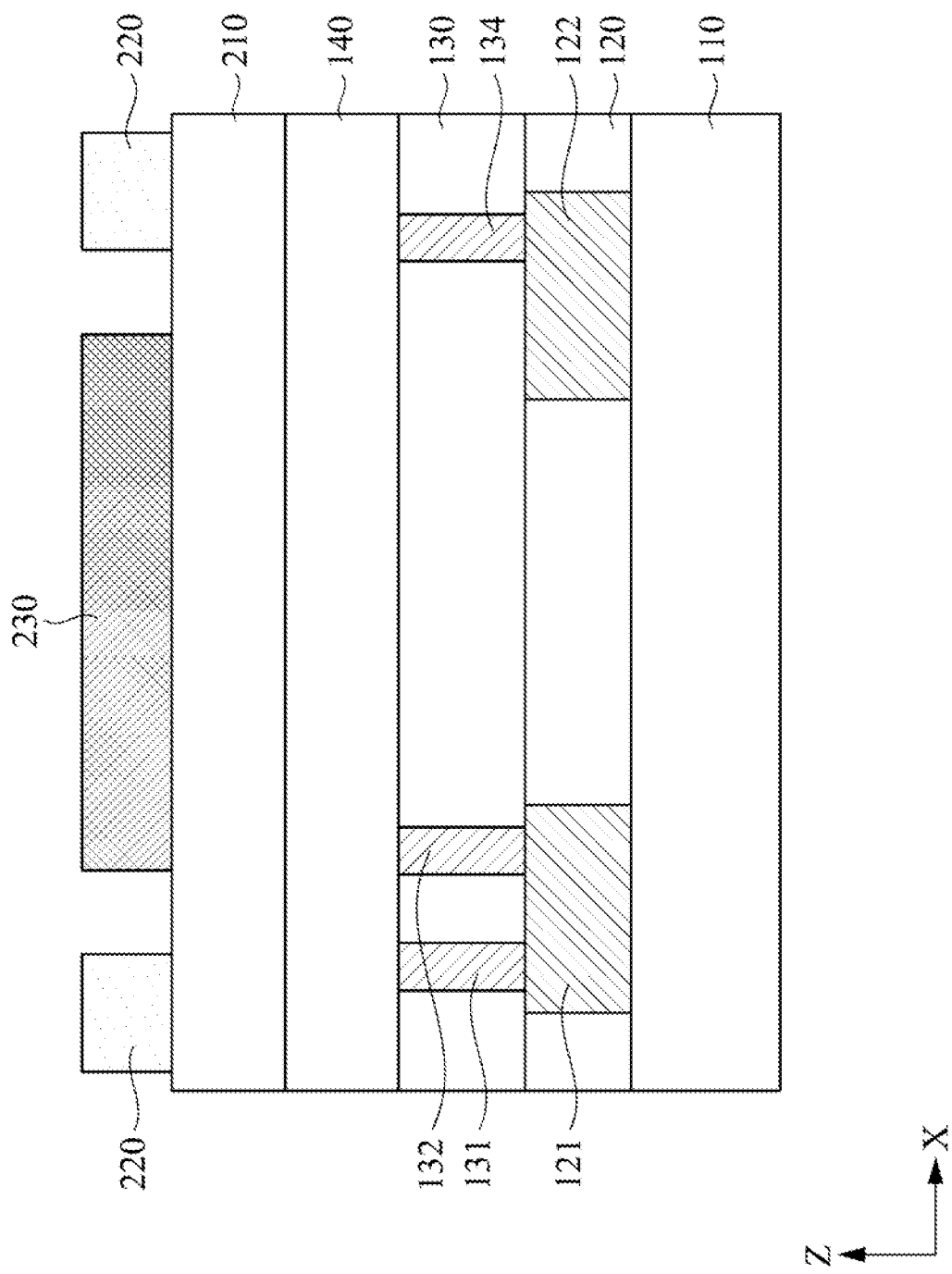
Figure 6C:
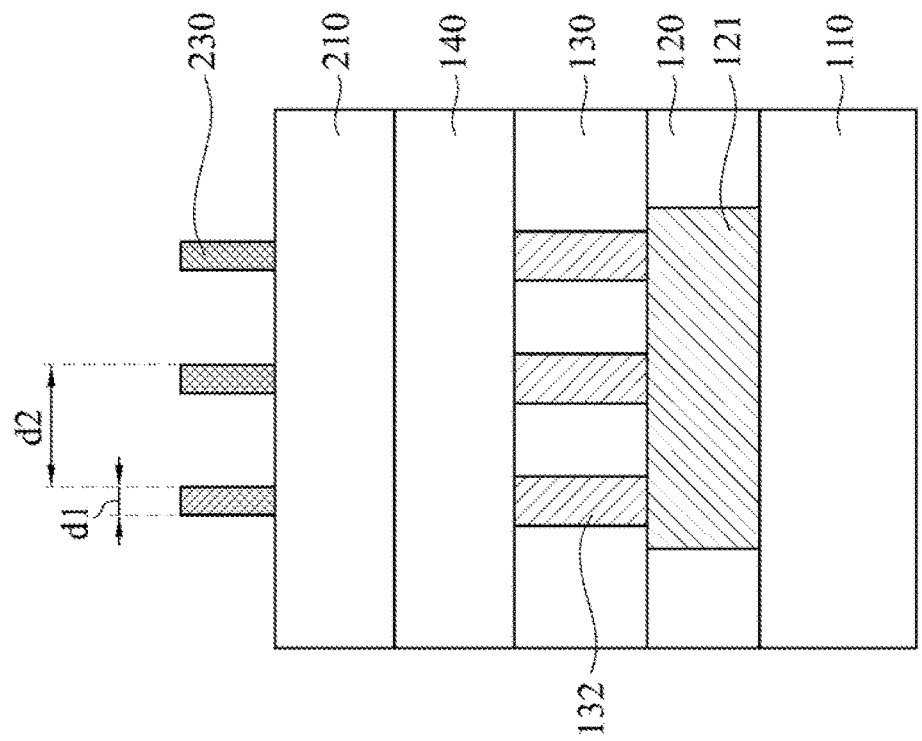

Reference is made in FIGS. 6A-6C. FIG. 6A is a schematic top view in a middle stage of forming a semiconductor structure. FIGS. 6B and 6C are cross-section views of FIG. 6A along different cross-section lines. In FIG. 6A, the conductors 121, 122 and the conductive vias 131, 132, 133 and 134 are covered by the dielectric layer 130, and the regions of the conductors 121, 122 and the conductive vias 131, 132, 133 and 134 are presented in dash-lines in FIG. 6A.

As shown in FIGS. 6A-6B, in this embodiment, mask layers 220 are formed on the hard mask 210. The mask layers 220 respectively overlap the conductive via 131 and the conductive via 134. The mask layers 220 are separated from each other in the direction X and extend in the direction Y. The mask layers 220 are used to form electrodes being in the third dielectric layer 140 and overlapping the conductive via 131 and the conductive vias 134, respectively. For details, please refer to the following discussion.

As shown in FIGS. 6A-6C, in this embodiment, a plurality of mandrel exposures 230 is formed on the hard mask 210. In the top view of FIG. 6A, the mandrel exposures 230 are separated from each other in direction Y extend in the direction X. The strip mandrel exposures 230 respectively overlap the conductive vias 132, and the mandrel exposures 230 and the conductive vias 133 are alternative. In this embodiment, one of the conductive vias 133 are respectively located at a center of immediately-adjacent two of the mandrel exposures 230.

In one or more embodiments of the present disclosure, the mandrel exposures 230 are used to pattern the hard mask 210. Specifically, the mandrel exposures 230 can be sacrificial material used to form further elements used for patterning the hard mask 210. In this embodiment, as shown in FIG. 6B, the mask layers 220 and the mandrel exposures 230 are at the same level. In some embodiments, the mask layers 220 and the mandrel exposures 230 can be formed in different operations. In some embodiments, the mask layers 220 and the mandrel exposures 230 can have the same material.

As shown in FIG. 6C, each of the mandrel exposures 230 is aligned with the conductive vias 132 and has a width d1 in the direction Y. A distance between immediately-adjacent tow of the mandrel exposures 230 is distance d2.

Figure 7:
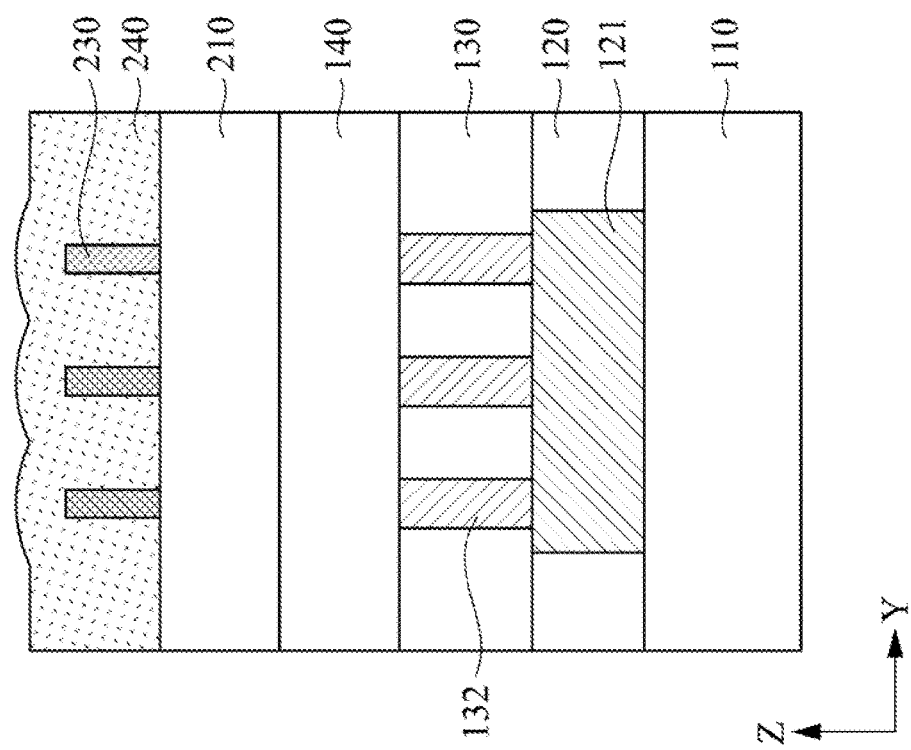

Reference is made in FIG. 7. Following FIG. 6C, FIG. 7 illustrates a cross-section view that the mandrel exposures 230 arranges. As shown in FIG. 7, a spacer layer 240 is further deposited on the mandrel exposures 230, so that the top surface of the hard mask 210, top surfaces and sidewalls of the mandrel exposures 230 are covered by the spacer layer 240. After the spacer layer 240 is formed, a top of the spacer layer 240 is higher than the top surfaces of the mandrel exposures 230.

Figure 8:
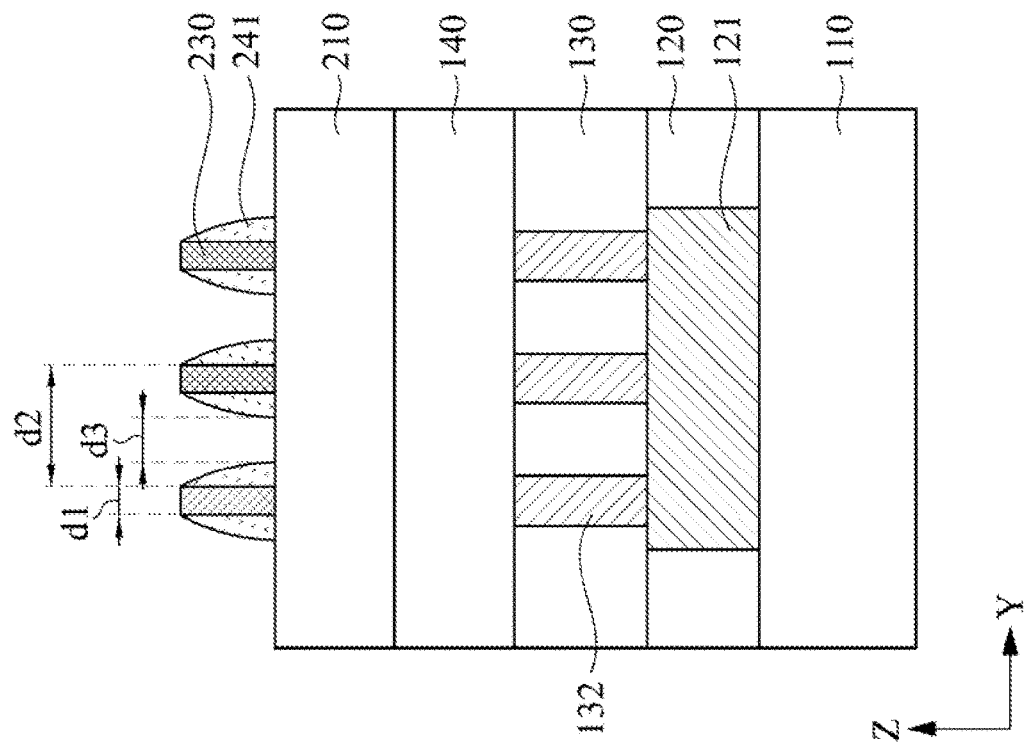

Following FIG. 7, in FIG. 8, the spacer layer 240 is etched to form a plurality of patterning spacers 241 on the sidewalls of the mandrel exposures 230. Specifically, the spacer layer 240 is etched so that the tops of the remaining spacer layer 240 are coplanar with the top surfaces of the mandrel exposures 230. The portions of the spacer layer 240 remains on the sidewalls of the mandrel exposures are regarded as patterning spacers 241. Each of the patterning spacers 241 extends from the top surface of one of the mandrel exposures to the top surface of the hard mask 210. In the cross-section view of FIG. 8, a distance d3 is between two of the patterning spacers 241, which are between immediately-adjacent two of the mandrel exposures 230.

Figure 9:
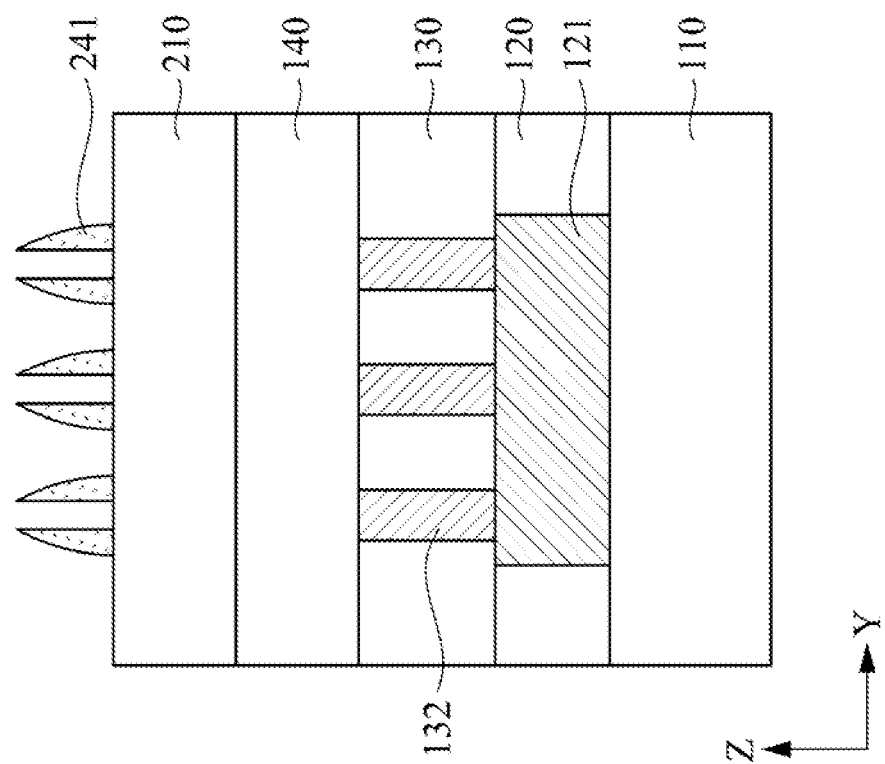

Following FIG. 8, in FIG. 9, the mandrel exposures 230 are removed. The patterning spacers 241 are then used for patterning the hard mask 210.

Figure 10:
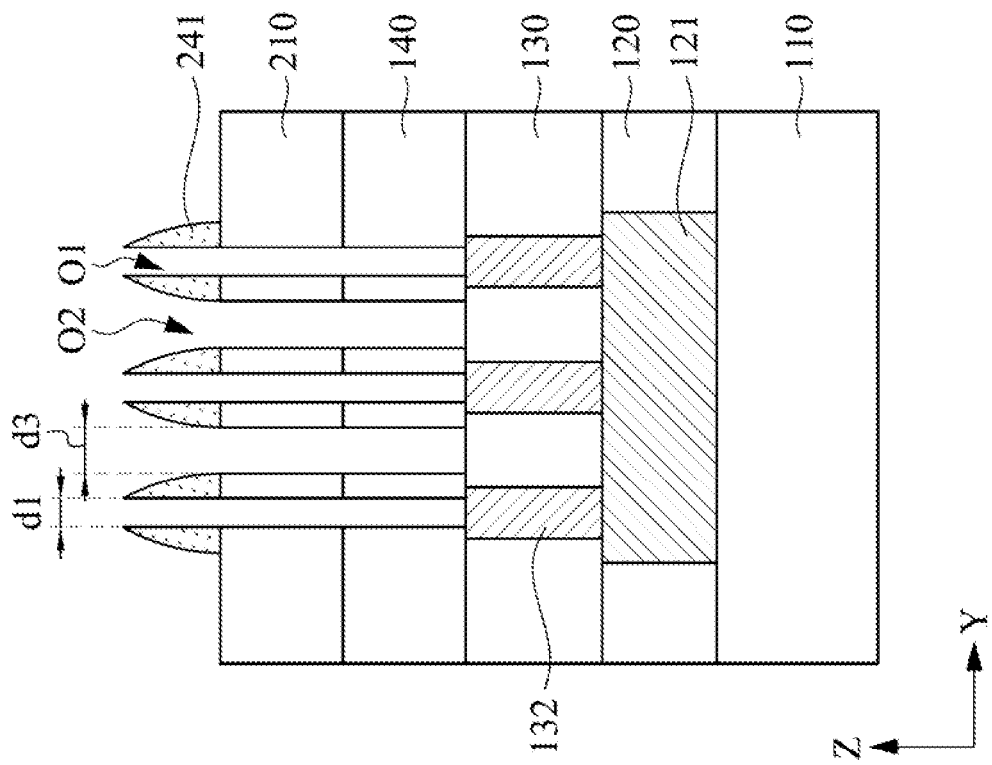

Following FIG. 9, in FIG. 10, the hard mask 210 is patterned based on the patterning spacers 241, and the third dielectric layer 140 is further etched based on the patterned hard mask 210. As shown in FIG. 10, a plurality of core openings O1 is formed and extends through the hard mask 210 and the third dielectric layer 140. The positions of the core openings O1 corresponding to position in which the mandrel exposure 230 originally located on, so that each of the core openings O1 has a width d1 in the direction Y.

Further, a plurality of gap openings O2 are formed through the hard mask 210 and the third dielectric layer 140. In this embodiment, the positions of the gap openings O2 correspond to gaps between two patterning spacer 241 located between the immediately-adjacent two of the mandrel exposures 230, and each of the gap openings O2 has a width d2 in the direction Y. No matter the width d1 or the width d3 is less than the distance d2 between the immediately-adjacent two of the mandrel exposures 230, and the critical dimension of the formed structure can be further reduced.

After the core openings O1 and the gap openings O2 are formed, the patterning spacers 241 are removed, and further structures can be formed in the core openings O1 and the gap openings O2 of the third dielectric layer 140.

In some embodiments, material of the patterning spacers 241 can includes photoresist material used for patterning the hard mask 210.

Figure 11A:
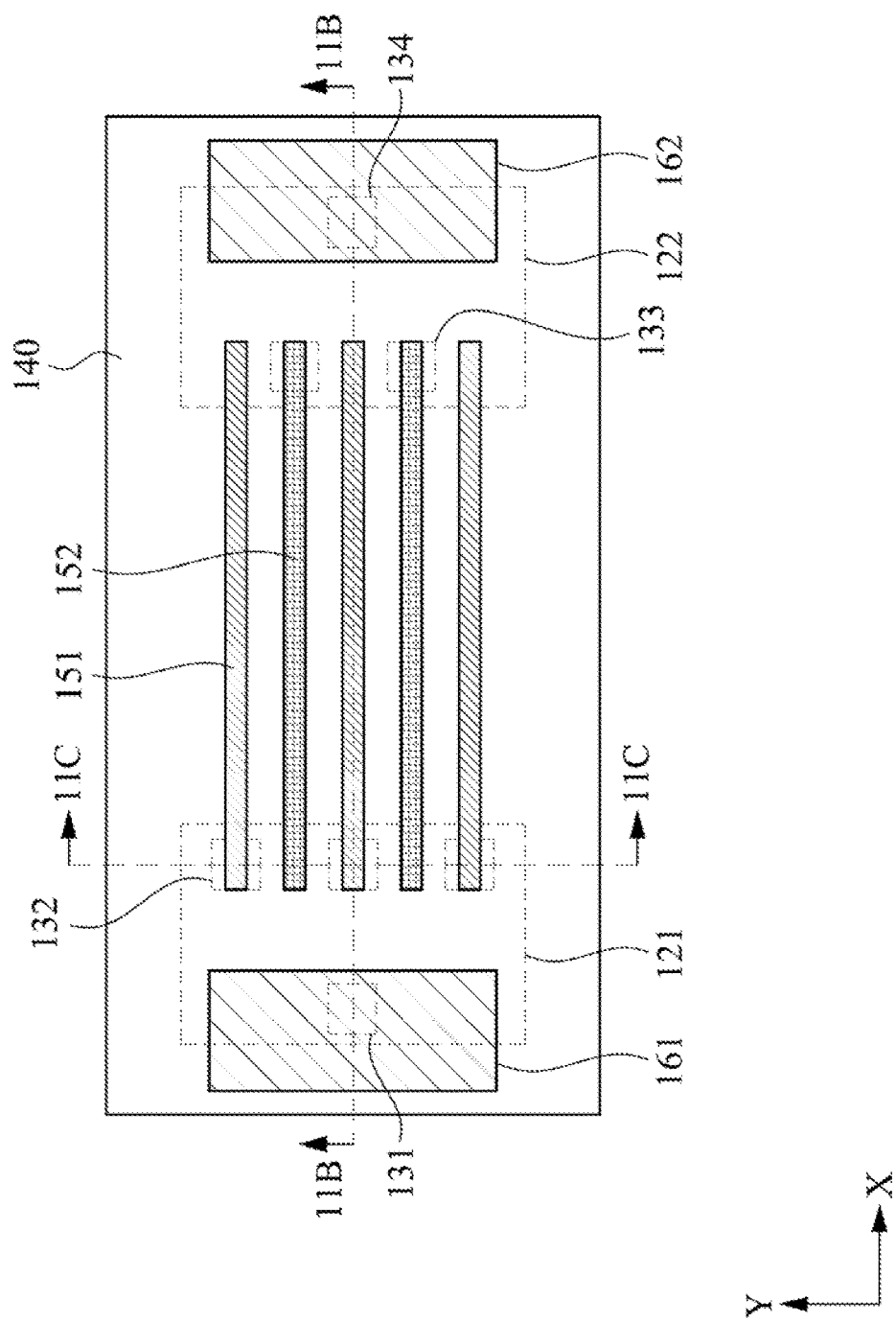
Figure 11B:
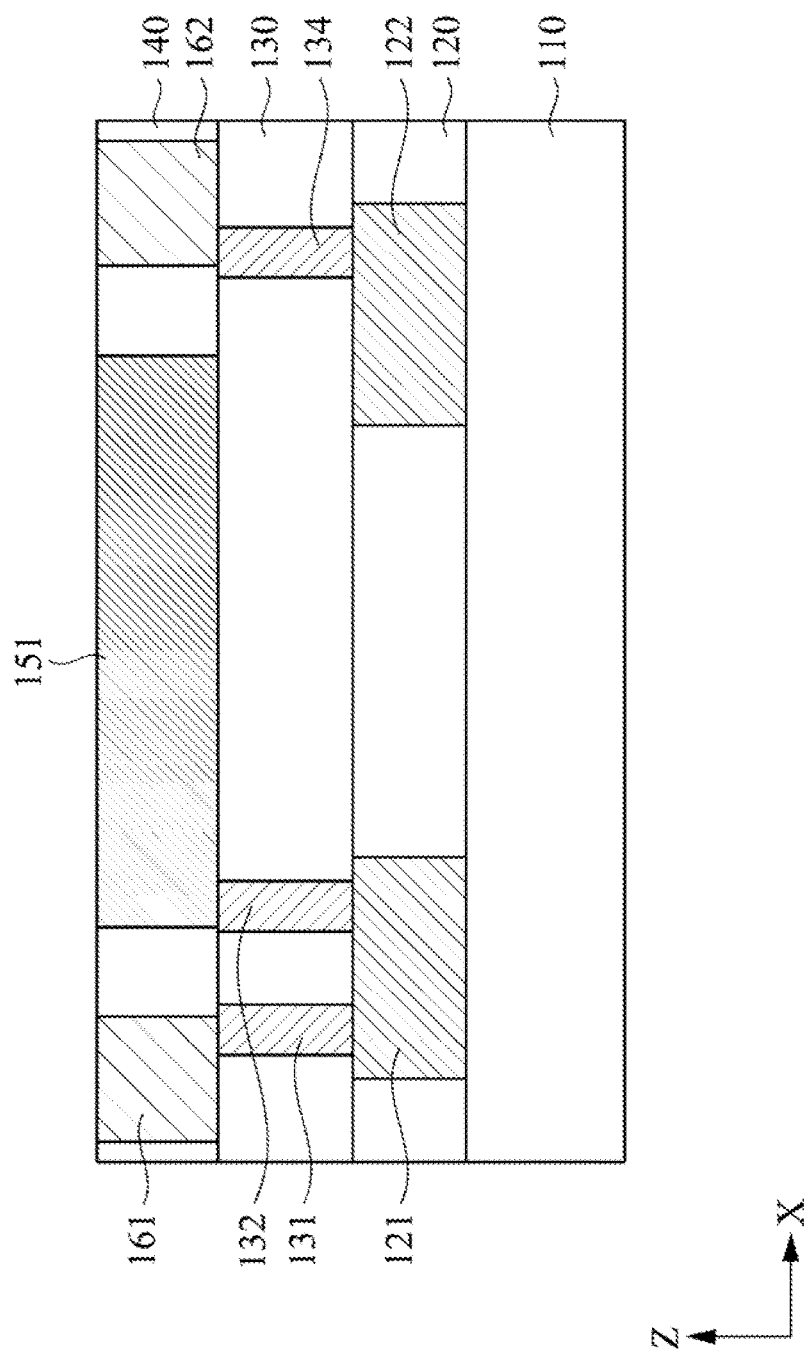
Figure 11C:
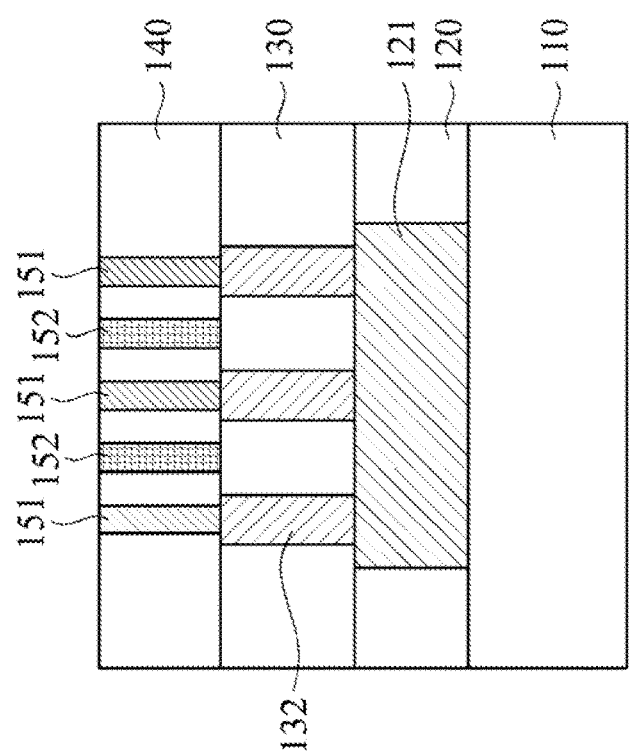

Reference is made in FIGS. 11A-11 following FIG. 10. FIG. 11A is a schematic top view in a middle stage of forming a semiconductor structure. FIGS. 11B and 11C are cross-section views of FIG. 11A along different lines.

In this embodiment, an electrode 161 and an electrode 162 are formed in the third dielectric layer 140, wherein the electrode 161 overlaps the conductive via 131 and the electrode 162 overlaps the conductive via 134. The electrode 161 and the electrode 162 extend in the direction Y and are separated from each other in the direction X. The electrode 161 and the electrode 162 can be formed based on the mask layers 220. In some embodiments, the hard mask 210 is patterned based on the mask layers 220 to form openings corresponding to the electrode 161 and the electrode 162 in the third dielectric layer 140, and conductive material are further filled with the openings to form the electrode 161 and the electrode 162 in the third dielectric layer 140. Since the mask layers 220 overlap the conductive via 131 and the conductive via 134, the formed electrode 161 and the formed electrode 162 also overlap and are connected to the conductive via 131 and the conductive via 134, respectively.

Further, as shown in FIGS. 11A-11C, a plurality of conductive lines 151 and a plurality of conductive lines 152 are formed in the third dielectric layer 140. The conductive lines 151 and the conductive lines 152 extend in the direction X and arrange alternatively in the direction X. The conductive lines 151 and the conductive lines 152 extend from a top of the conductor 121 to a top of the conductor 122. The conductive lines 151 are formed in the core openings O1 in the third dielectric layer 140 and can be regarded as core conductive lines. The conductive lines 151 respectively overlap and connected to the conductive vias 132.

As shown in FIG. 11B, the conductive lines 151 and the electrode 161 are at the same level and separated from each other in the direction X. The electrode 161 is connected to the conductor 121 through the conductive via 131. The conductive lines 151 are connected to the conductor 121 through the conductive vias 132. By the conductor 121 at the level different from the level in which the conductive lines 151 and the electrode 161 are at, and the conductive lines 151 and the electrode 161 are able to be connected to each other. The conductive lines 151 are isolated from the conductor 122 since the conductive lines 151 do not overlap any of the conductive vias 132.

In FIG. 11A, the conductive lines 152 are formed in the gap openings O2 and can be regarded as gap conductive lines. Since the conductive vias 133 and the conductive vias 132 are alternatively arranged in the direction Y, the conductive lines 152 respectively overlap and are connected to the conductive vias 133. By the conductor 122 at the level different from the level in which the conductive lines 152 and the electrode 162 are at, and the conductive lines 152 and the electrode 162 are able to be connected to each other. The conductive lines 152 are isolated from the conductor 121 since the conductive lines 152 do not overlap any of the conductive vias 131.

After the conductive lines 151, 152 and the electrode 161, 162 are formed, a semiconductor structure 100 is provided. The semiconductor structure 100 includes the substrate 110, the dielectric layer 120, the dielectric layer 130 and the dielectric layer 140. The semiconductor structure 100 further includes the conductors 121 and 122 being in the dielectric layer 120 and separated from each other in the direction X. The semiconductor structure 100 further includes the conductive vias 131 and 132 overlapping the conductor 121 and the conductive vias 133 and 134 overlapping the conductor 122 in the dielectric layer 130. The semiconductor structure 100 further includes electrode 161 and 162 being in the dielectric layer 140 and separated from each other. The semiconductor structure 100 further includes the conductive lines 151 and 152 being in the dielectric layer 140 and extends in the direction X. The electrode 161 and the conductive lines 151 are connected to the conductor 121 by the conductive via 131 and the conductive vias 132, respectively. The electrode 166 and the conductive lines 152 are connected to the conductor 122 by the conductive via 133 and the conductive vias 134, respectively. A distance between immediately-adjacent two of the conductive vias 132 or immediately-adjacent two of the conductive vias 133 is greater than a distance between the conductive line 151 and the immediately-adjacent one of the conductive line 152 in the direction Y.

In one or more embodiments, the conductive lines 151 and 152 are able to be connected to one or more transistors to be tested. For example, the conductive lines 151 and 152 are exposed from the top surface of the dielectric layer 140, and the conductive lines 151 and 152 can be designed to have routings used to receive one or more transistors to be tested (not shown in figures) from the top or from the substrate 110 through the dielectric layers 120, 130 and 140. For example, two ends of the transistor to be test are connected to the conductive lines 151 and 152, respectively. One of the electrodes 161 and 162 is applied by an input voltage and another one of the electrodes 161 and 162 is applied by an output voltage.

Figure 12:
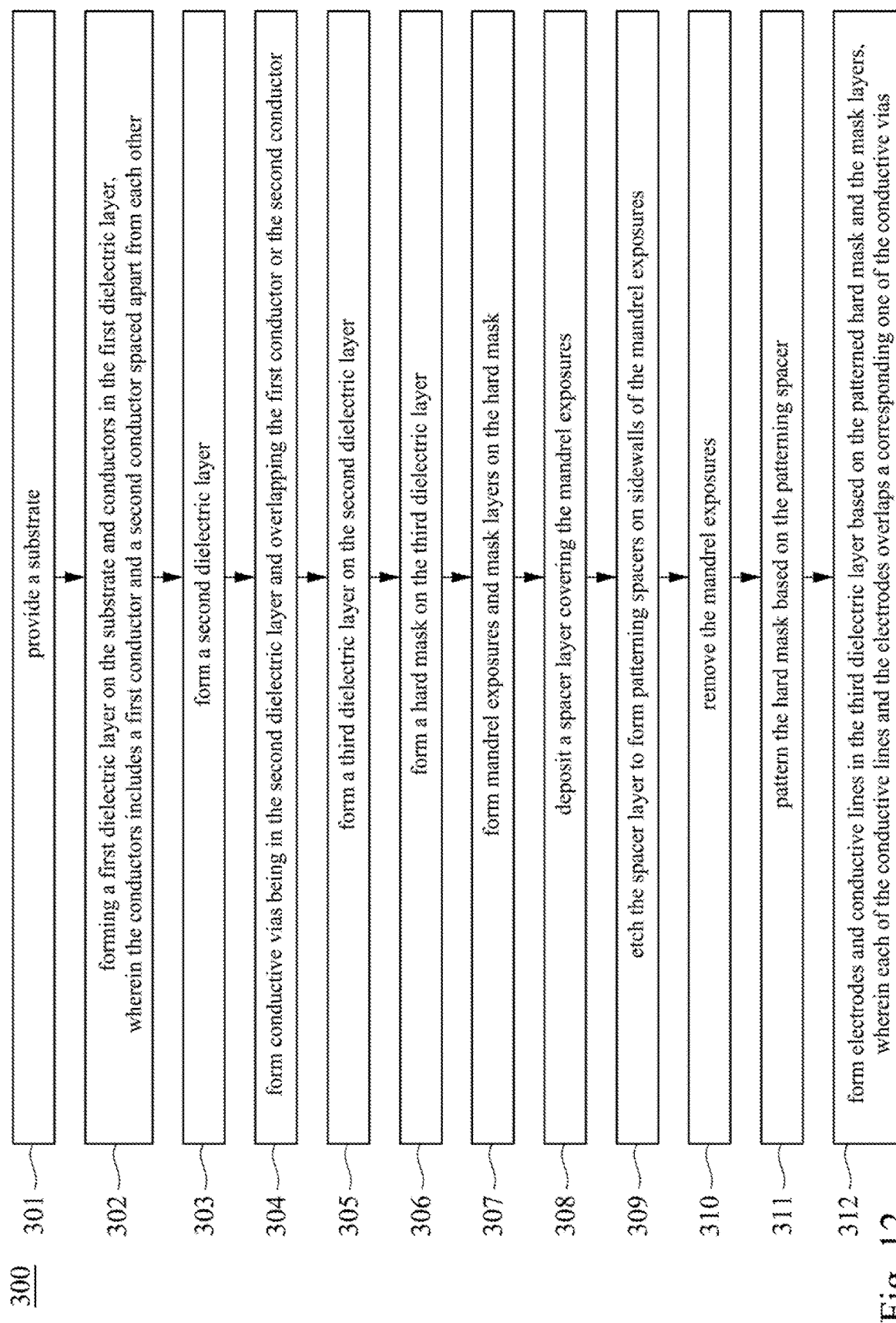
FIG. 12 illustrates a flowchart of a method of forming a semiconductor structure according to one or more embodiments of the present disclosure.

Reference is made in FIG. 12. FIG. 12 illustrates a flowchart of a method 300 of forming a semiconductor structure according to one or more embodiments of the present disclosure. The method 300 includes operations 301-312. Reference is also made in FIGS. 1A-11C to describe the method 300. The method 300 is presented with an improved SADP process to connect structures isolated at the same level from each other by an additional connection structure at a different level.

Referring to FIGS. 1A and 1B, in operation 301, a substrate 110 is provided.

Referring to FIGS. 2A and 2B, in operation 302, a first dielectric layer 120 on the substrate 110 and conductors 121, 122 are formed in the first dielectric layer 120, wherein the conductors 121, 122 include a first conductor 121 and a second conductor 122 separated from each other in the direction X.

Referring to FIGS. 3A and 3B, in operation 303, a second dielectric layer 130 is formed on the first dielectric layer 120.

Referring to FIGS. 4A to 4C, in operation 304, a plurality of conductive vias 131, 132, 133 and 134 are formed in the second dielectric layer 130 and overlaps the first conductor 121 or the second conductor 122.

Referring to FIGS. 5A to 5C, in operation 305, a third dielectric layer 140 is formed on the second dielectric layer 130. Following operation 305, in operation 306, a hard mask 210 is formed on the third dielectric layer 140.

Referring to FIGS. 6A to 6C, in operation 307, a plurality of mandrel exposures 230 and a plurality of mask layers 220 are formed on the hard mask 210. The mandrel exposures 230 extend in direction X.

Referring to FIG. 7, in operation 308, a spacer layer 240 is deposited to cover the mandrel exposures 230.

Referring to FIG. 8, in operation 309, the spacer layer 240 is etched to form a plurality of patterning spacers 241 on sidewalls of the mandrel exposures 230. The patterning spacers 241 also extend in the direction X along the mandrel exposures 230.

Referring to FIG. 9, in operation 310, the mandrel exposures 230 are removed.

Referring to FIG. 10, in operation 311, the hard mask 210 is patterned based on the patterning spacer 241. A plurality of core openings O1 and a plurality of gap openings O2 are formed and extend through the third dielectric layer 140 to the top surface of the second dielectric layer. The conductive vias 132 and the conductive vias 133 are exposed from the core openings O1 and the gap openings O2, respectively.

Referring to FIGS. 11A-11C, in operation 312, electrodes 161, 162 and conductive lines 151, 152 are formed in the third dielectric layer 140 based on the patterned hard mask 210 and the mask layers 220, wherein each of the conductive lines 151, 152 and the electrodes 161, 162 overlaps a corresponding one of the conductive vias 131, 132, 133 or 134. Therefore, the electrode 161 and the conductive lines 151 are connected to each other by the below conductor 121, and the electrode 162 and the conductive lines 152 are connected to each other by the below conductor 122.

Figure 13:
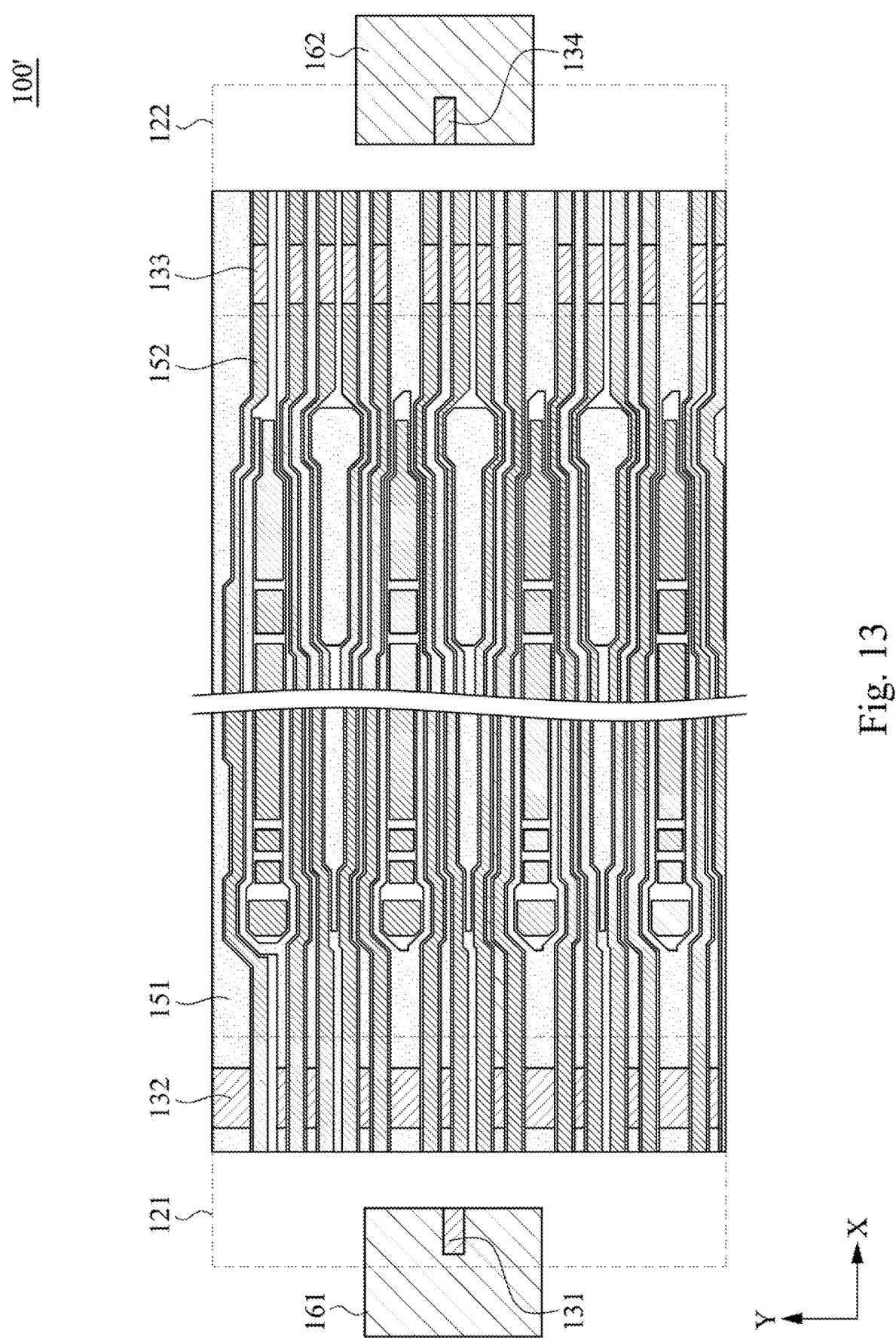
FIG. 13 illustrates a schematic top view of a semiconductor structure according to one or more embodiments of the present disclosure.

FIG. 13 illustrates a schematic top view of a semiconductor structure 100' according to one or more embodiments of the present disclosure. For the purpose of simple description, similar labels are used for the similar elements, and some circuits in the center region are ignored.

As shown in FIG. 13, in this embodiment, the semiconductor structure 100' is formed on the substrate (not shown in figures). The semiconductor structure 100' includes common conductors 121 and 122 separated from each other in the direction X at a first level. A plurality of conductive vias 131, 132, 133 and 134 are formed at a second level higher than the first level, wherein the conductive vias 132 and the conductive vias 133 extend in the direction Y. Electrodes 161, 162 and a plurality of conductive lines 151, 152 are formed at a third level higher than the second level, wherein the electrodes 161, 162 and the conductive lines 151, 152 are spatially isolated from each other.

Therefore, the electrode 161 and the conductive lines 151 are connected to each other by the below conductor 121, and the electrode 162 and the conductive lines 152 are connected to each other by the below conductor 122. The semiconductor structure 100' can be formed by the method 300 with improved SADP process or other similar operation in the present disclosure.

Figure 14A:
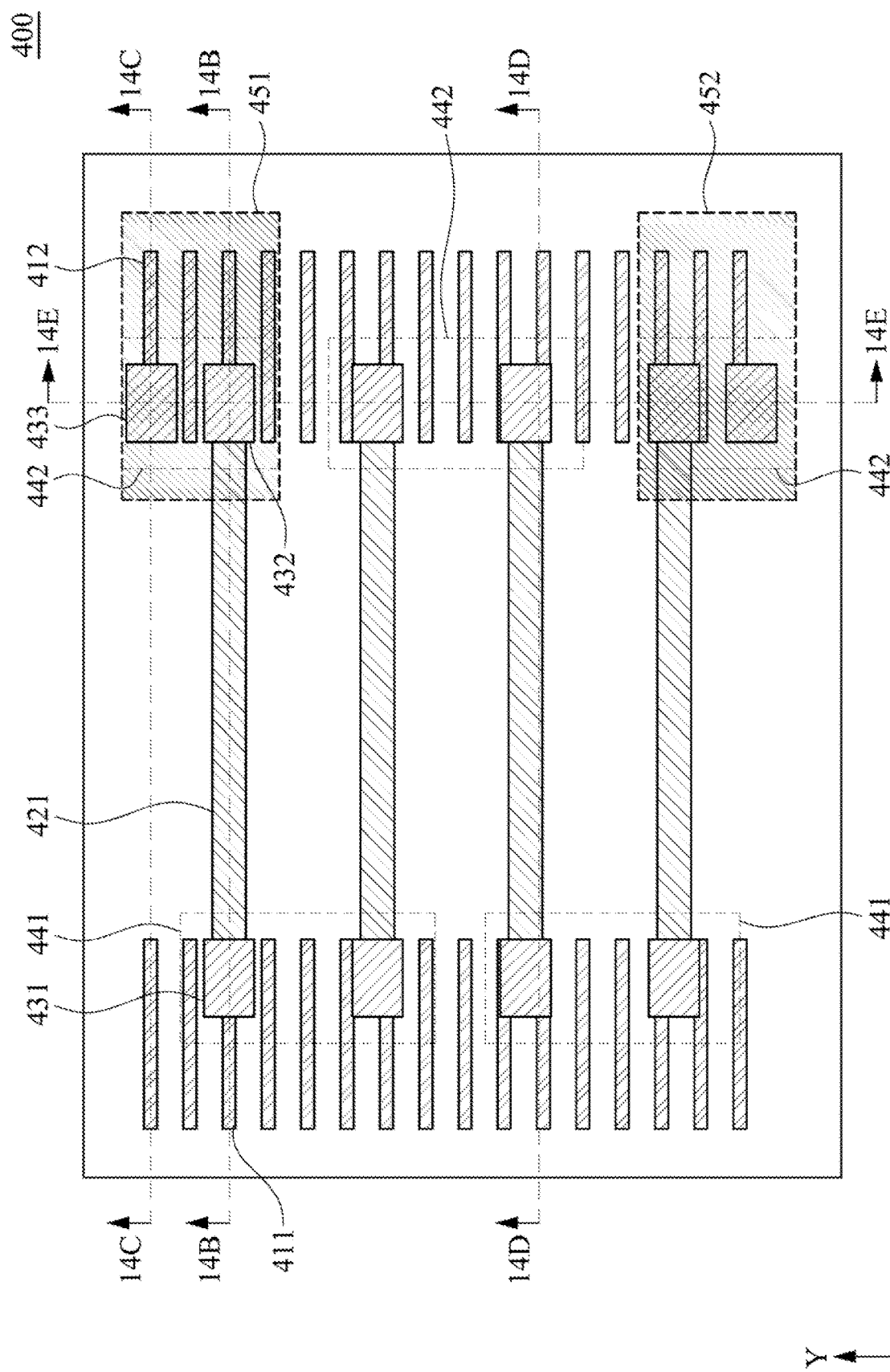
FIG. 14A illustrates a schematic top view of a semiconductor structure according to one or more embodiments of the present disclosure.

Reference is made in FIGS. 14A-14E. FIG. 14A illustrates a schematic top view of a semiconductor structure 400 according to one or more embodiments of the present disclosure. FIGS. 14B-14E illustrate schematic cross-section views of the semiconductor structure 400 of FIG. 14A. FIGS. 14A-14E illustrate an embodiment that the electrodes are arranged in the same side of the conductive lines.

As shown in FIGS. 14A-14E, in this embodiment, the semiconductor structure 400 includes a substrate 410, a dielectric layer 420 formed on the substrate, a dielectric layer 430 formed on the dielectric layer 420, a dielectric layer 440 formed on the dielectric layer 430 and a dielectric layer 450 formed on the dielectric layer 440. A top of the substrate 410 includes dielectrics, and a plurality of conductive lines 411 and 412 are formed on the top of the substrate 410.

In this embodiment, the conductive lines 411 and 412 are formed by a SADP process. For example, the conductive lines 411 and 412 can be formed by operations similar to operations 307-312 of the method 300. In FIG. 14A, the conductive lines 411 and 412 extend in direction X. The conductive lines 411 are separated from the conductive lines 412 in the direction X. The conductive lines 411 are arranged in the direction Y. The conductive lines 412 are arranged in the direction Y.

In one or more embodiments, the conductive lines 411 and 412 can be connected to transistors to be tested (not shown in figures). For example, the transistor to be tested can be disposed beyond a region between the conductive lines 411 and the conductive lines 412. In this embodiment, the semiconductor structure 400 can be regarded as a test structure, and some of the conductive lines 411 and 412 are further connected to elements above. That is, for a plurality of transistors connected to the conductive lines 411 or 412, few of the transistors are randomly selected to be tested, so that electrical properties of the selected transistors can be measured to response qualities of the transistors. After the qualities of the transistors are determined by the semiconductor structure 400, the semiconductor structure 400 is removed.

Figure 14B:
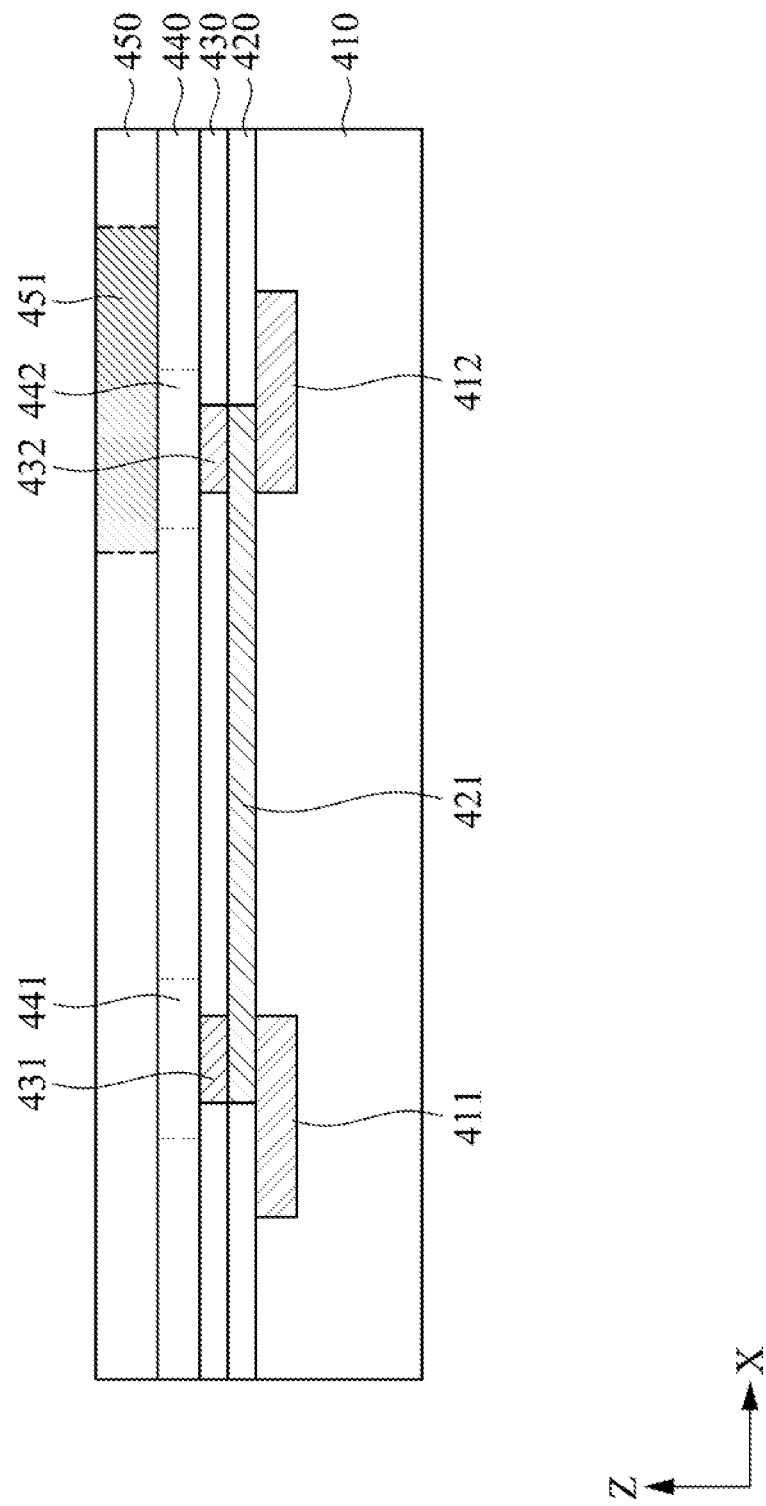
FIGS. 14B-14E illustrate schematic cross-section views of the semiconductor structure of FIG. 14A.
Figure 14C:
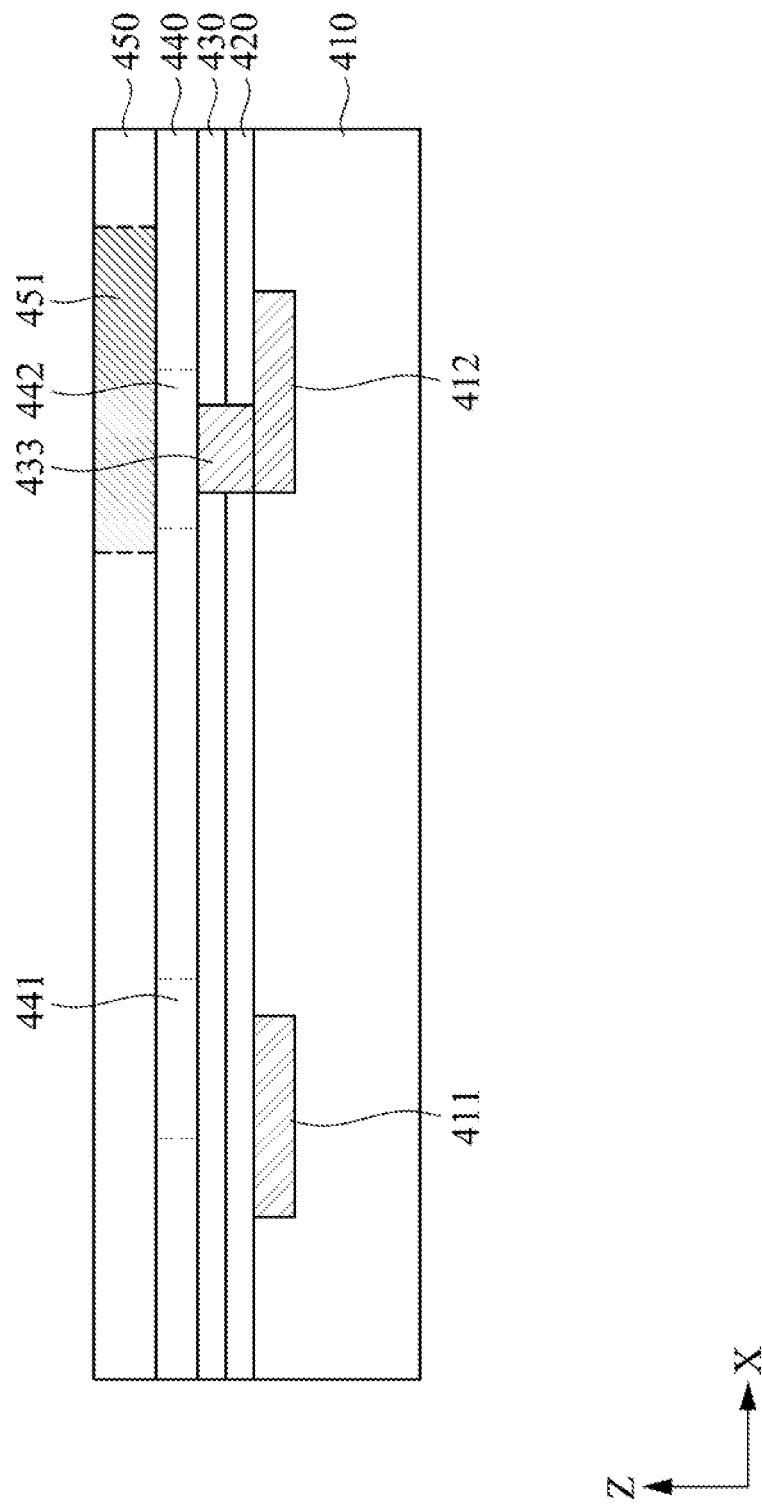
Figure 14D:
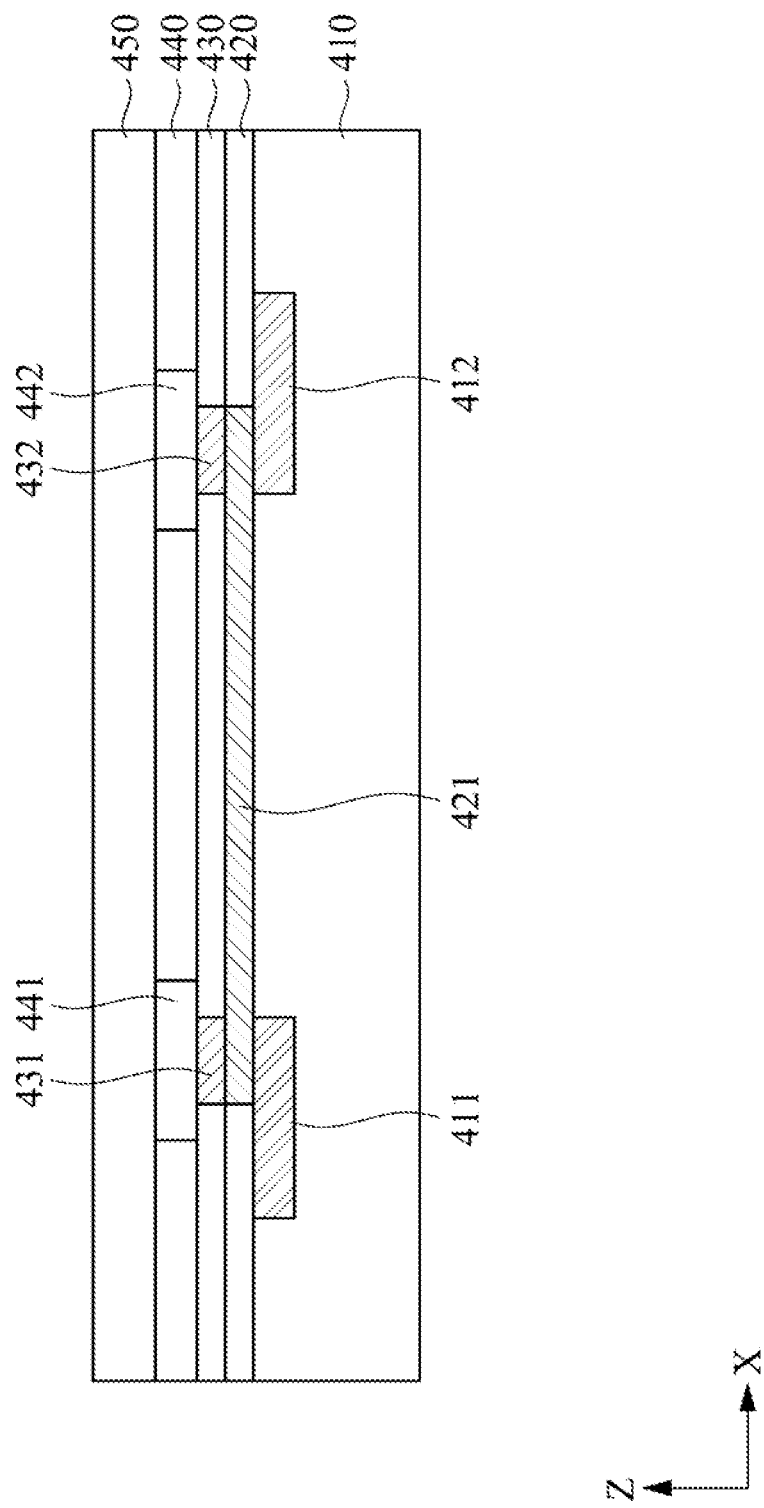

As shown in FIG. 14A, in this embodiment, a plurality of conductive lines 421 is formed in the dielectric layer 420 on the substrate 410. The conductive lines 421 extend in the direction X and arranged in direction Y. Some of the conductive lines 421 are connected to the conductive lines 411 and the conductive lines 412. As shown in FIGS. 14B and 14D, two ends of one of the conductive lines 421 are connected to one of the conductive lines 411 and one of the conductive lines 412, respectively.

A plurality of conductive vias 431 and 432 are formed in the dielectric layer 430. As shown in FIG. 14A, the conductive vias 431 and the conductive vias 432 extend in the direction Y and arranged in the direction Y. The conductive vias 431 and the conductive vias 432 are respectively located at two ends of the conductive lines 421. Each of the conductive vias 431 and 432 overlaps one of the conductive lines 421.

A plurality of conductors 441 and a plurality of conductors 442 are formed in the dielectric layer 440. As shown in FIG. 14A, the conductors 441 extend in the direction Y and arranged in the direction Y, and the conductors 442 also extend in the direction Y and arranged in the direction Y. The conductors 441 and the conductor 442 are separated from each other in the direction Y. The conductors 441 are used to electrically connect some of the conductive lines 411 at the same level from each other, and the conductors 442 are used to electrically connect some of the conductive lines 412 at the same level from each other.

Figure 14E:
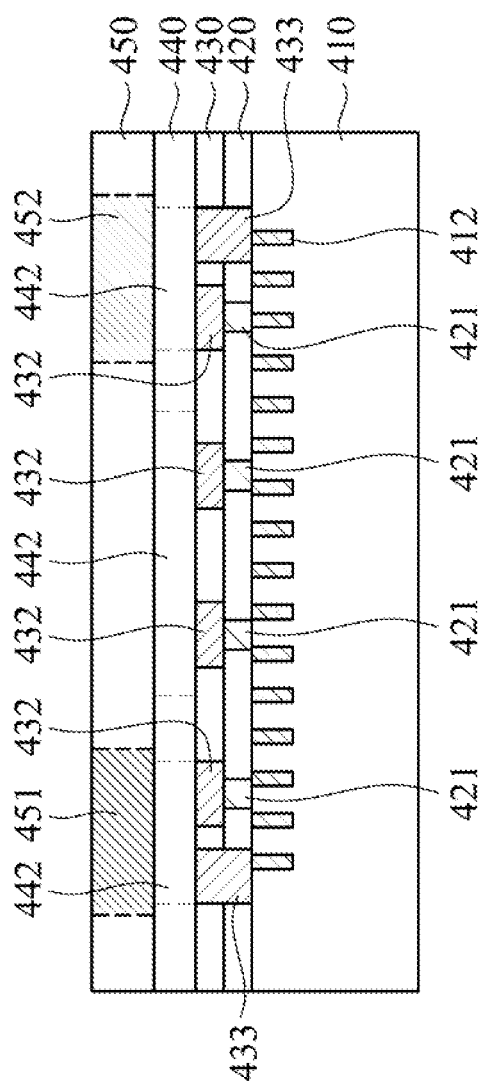

Additionally, in this embodiment, a plurality of conductive vias 433 is provided. The conductive vias 433 extend through the dielectric layer 420 and the dielectric layer 430. As shown in FIG. 14E, the conductive vias 433 do not overlap the conductive lines 421, and the each of the conductive vias 433 is directly connected between one of the conductive lines 412 and one of the conductors 441.

An electrode 451 and an electrode 452 are formed in the dielectric layer 450. As shown in FIGS. 14A and 14E, in this embodiment, two electrodes 451 and 452 are disposed at the same side of the conductive lines 421. In FIG. 14A, the electrode 451 and the electrode 452 extend in the direction X and separated from each other in the direction Y. In FIGS. 14A-14E, the electrode 451 overlaps one of the conductors 442, and the electrode 452 overlaps another one of the conductors 442. In other words, in this embodiment, the electrode 451 is in contact with one of the conductors 442, and the electrode 452 is in contact with another one of the conductors 442. In some embodiments, the electrode 451 can be used as an input port and the electrode 452 can be used as an output port for the semiconductor structure 400.

The semiconductor structure 400 can be formed by an improved SADP process. In the embodiment as shown in FIGS. 14A-14E, in order to connect the conductive lines (e.g. conductive lines 411 or 412) arranged at the same level from each other, the common conductors (e.g., conductors 441 and 442) are used for connecting the conductive lines from another level.

In summary, improved semiconductor structures and method of forming the improved semiconductor structures with SADP process are provided. For a layout design used for SADP process, a stitch-like structure used to connected structures in the same level would be felt. Particularly, the structures in the same level have small critical dimension. In one or more embodiments of the present disclosure, common conductors at a different level are provided, so that the structures in the same level can be connected to each other by the common conductors. The rule of layout design for the SADP process can be further improved.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this disclosure provided they fall within the scope of the following claims.

What is claimed is:

1. A method of forming a semiconductor structure, comprising:
    forming a plurality of conductors in a first dielectric layer on a substrate, wherein the conductors extend in a first direction;
    forming a plurality of first conductive vias in a second dielectric layer on the substrate, wherein each of the first conductive vias overlaps one of the conductors;
    forming a third dielectric layer on the substrate;
    forming a plurality of electrodes in the third dielectric layer, wherein each of the electrodes overlaps one of the first conductive vias;
    forming a hard mask on the third dielectric layer;
    forming a plurality of mandrel exposures on the hard mask, wherein the mandrel exposures extend in a second direction different from the first direction;
    forming a plurality of patterning spacers on sidewalls of the mandrel exposures;
    removing the mandrel exposures;
    patterning the hard mask based on the patterning spacers; and
    forming a plurality of conductive lines in the third dielectric layer based on the patterned hard mask, wherein the conductive lines extend in the second direction and are separated from the electrodes in the second direction, and each of the conductive lines overlaps a corresponding one of the first conductive vias.

2. The method of claim 1, wherein the third dielectric layer is directly above or directly below the second dielectric layer.

3. The method of claim 1, wherein forming the patterning spacers on the sidewalls of the mandrel exposures comprises:
    depositing a spacer layer covering the mandrel exposures and a top surface of the third dielectric layer; and
    etching the spacer layer to expose tops of the mandrel exposures, wherein the spacer layer remaining on the sidewalls of the mandrel exposures forms the patterning spacers.

4. The method of claim 1, wherein the mandrel exposures are formed to be aligned with the first conductive vias.

5. The method of claim 1, wherein the conductors comprise a first conductor and a second conductor arranged in the first direction.

6. The method of claim 1, wherein the conductors comprise a first conductor and a second conductor separated from each other in the second direction.

7. The method of claim 1, wherein the electrodes comprises a first electrode and a second electrode arranged in the first direction.

8. The method of claim 7, wherein the conductors comprise a first conductor, a second conductor and a third conductor, the second conductor is between the first conductor and the third conductor in the first direction, the second conductor is at a first side of the conductive lines, the first conductor and the third conductor is at an opposite second side of the conductive lines, and the first electrode and the second electrode overlap the first conductor and the third conductor, respectively.

9. The method of claim 1, further comprising:
    forming a second conductive via extending from one of the conductive lines to one of the conductors, wherein one of the electrodes overlaps the second conductive via.

10. A method of forming a semiconductor structure, comprising:
    forming a first conductor in a first dielectric layer on a substrate, wherein the first conductor extends in a first direction;
    forming a second dielectric layer on the first dielectric layer and a plurality of first conductive vias in the second dielectric layer, wherein the first conductive vias overlap the first conductor and are arranged in the first direction;
    forming a third dielectric layer on the second dielectric layer;
    forming a hard mask on the third dielectric layer;
    forming a plurality of mandrel exposures on the hard mask, wherein the mandrel exposures are separated from each other in the first direction, extend in a second direction different from the first direction and respectively overlap the first conductive vias;
    depositing a spacer layer on the mandrel exposures;
    etching the spacer layer to form a plurality of patterning spacers on sidewalls of the mandrel exposures, wherein the patterning spacers extend in the second direction and are separated from each other in the first direction, each of the patterning spacers extends from a top of one of the mandrel exposures to a top surface of the hard mask, and immediately-adjacent two of the patterning spacers are located between immediately-adjacent two of the mandrel exposures;
    removing the mandrel exposures;
    patterning the hard mask by the patterning spacers; and
    forming a plurality of first conductive lines and a plurality of second conductive lines in the third dielectric layer based on the patterned hard mask, wherein the first conductive lines and the second conductive lines extend in the second direction and alternatively arranged in the first direction, and each of the first conductive lines overlaps one of the first conductive vias.

11. The method of claim 10, further comprising:
forming a second conductive via in the second dielectric layer, wherein the second conductive via is separated from the first conductive vias in the second direction and overlaps the first conductor; and
forming an electrode in the third dielectric layer, wherein the electrode overlaps the first conductor and is connected to second conductive via.

12. The method of claim 10, further comprising:
forming a second conductor in the first dielectric layer, wherein the second conductor extends in the first direction and is separated from the first conductor in the second direction; and
forming a plurality of second conductive vias in the second dielectric layer, wherein the second conductive vias overlap the second conductor and are arranged in the first direction, and the second conductive lines are connected to the second conductive vias after the first conductive lines and the second conductive lines are formed.

13. The method of claim 12, further comprising:
forming a third conductive via being in the second dielectric layer and overlaps the first conductor, wherein the third conductive via is separated from the first conductive vias in the second direction;
forming a fourth conductive via being in the second dielectric layer and overlaps the second conductor, wherein the fourth conductive via is separated from the second conductive vias in the second direction;
forming a first electrode being in the third dielectric layer and overlapping the third conductive via; and
forming a second electrode being in the third dielectric layer and overlapping the fourth conductive via.

14. The method of claim 10, wherein a width of each of the first conductive lines in the first direction is equal to a width of each of the mandrel exposures in the first direction, and a width of each of the second conductive lines in the first direction is equal to a distance between immediately-adjacent two of the patterning spacers located between immediately-adjacent two of the mandrel exposures in the first direction.

15. The method of claim 10, further comprising:
connecting the first conductive lines and the second conductive lines to a plurality of transistors on the substrate.

16. A semiconductor structure, comprising:
a substrate;
a first dielectric layer located at a first level on the substrate;
a plurality of conductors located in the first dielectric layer, wherein the conductors extend in a first direction;
a second dielectric layer located at a second level on the substrate;
a plurality of conductive vias located in the second dielectric layer, wherein each of the conductive vias overlaps one of the conductors;
a third dielectric layer located at a third level on the substrate;
a plurality of conductive lines located in the third dielectric layer, wherein the conductive lines extend in a second direction different from the first direction, a distance between immediately-adjacent two of the conductive lines is less than a distance between immediately-adjacent two of the conductive vias in the first direction, and each of the conductive lines overlaps one of the conductive vias; and
a plurality of electrodes located in the third dielectric layer, wherein each of the electrodes is connected to one of the conductive vias.

17. The semiconductor structure of claim 16, wherein the first level is directly above or directly below the second level.

18. The semiconductor structure of claim 16, wherein:
the conductors comprise a first conductor and a second conductor, the first conductor and the second conductor are located at a first side and a second side opposite to the first side of the conductive lines,
the conductive lines comprise a plurality of first conductive lines and a plurality of second conductive lines, the first conductive lines and the second conductive lines are alternatively arranged in the first direction and spatially isolated from each other, the first conductive lines are connected to the first conductor, and the second conductive lines are connected to the second conductor.

19. The semiconductor structure of claim 18, wherein the conductive vias comprise a plurality of first conductive vias at the first side of the conductive lines and a plurality of second conductive vias at the second side of the conductive lines.

20. The semiconductor structure of claim 16, further comprising:
a transistor located in the substrate and connected to the conductive lines.

* * * * *